United States Patent
Greenberg et al.

(10) Patent No.: US 12,182,690 B2
(45) Date of Patent: Dec. 31, 2024

(54) MTJ-BASED HARDWARE SYNAPSE IMPLEMENTATION FOR BINARY AND TERNARY DEEP NEURAL NETWORKS

(71) Applicant: TECHNION RESEARCH & DEVELOPMENT FOUNDATION LIMITED, Haifa (IL)

(72) Inventors: Tzofnat Greenberg, Afula (IL); Shahar Kvatinsky, Kibbutz Hannaton (IL); Daniel Soudry, Haifa (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 1031 days.

(21) Appl. No.: 17/113,252

(22) Filed: Dec. 7, 2020

(65) Prior Publication Data
US 2021/0174182 A1    Jun. 10, 2021

Related U.S. Application Data

(60) Provisional application No. 62/943,887, filed on Dec. 5, 2019.

(51) Int. Cl.
*G06N 3/063*    (2023.01)
*G11C 11/54*    (2006.01)

(52) U.S. Cl.
CPC .............. *G06N 3/063* (2013.01); *G11C 11/54* (2013.01)

(58) Field of Classification Search
CPC .................................. G06N 3/063; G11C 11/54
See application file for complete search history.

(56) References Cited

U.S. PATENT DOCUMENTS

| 9,754,203 B2 | 9/2017 | Di Castro et al. |
| 2019/0280694 A1* | 9/2019 | Obradovic ............. H03K 19/20 |
| 2019/0332943 A1* | 10/2019 | Obradovic ............. G06N 3/082 |

FOREIGN PATENT DOCUMENTS

CN    107194462 A  *  9/2017  ............. G06N 3/063

OTHER PUBLICATIONS

Natsui et al., "Design of an energy-efficient XNOR gate based on MTJ-based nonvolatile logic-in-memory architecture for binary neural network hardware," Jpn. J. Appl. Phys. 58 SBBB01 (Year: 2019).*

(Continued)

*Primary Examiner* — Shahid K Khan
(74) *Attorney, Agent, or Firm* — The Roy Gross Law Firm, LLC; Roy Gross

(57) ABSTRACT

A stochastic synapse for use in a neural network, comprising: first and second magnetic tunnel junction (MTJ) devices, each MTJ device having a fixed layer port and a free layer port; a first and second control circuit, each connected respectively to the free layer port of the first and second MTJ devices, wherein the fixed layer ports of the first and second MTJ devices are connected to each other; wherein the first and second control circuits are configured to perform a gated XNOR operation between synapse and activation values; and wherein an output of the gated XNOR is represented by the output current through both of the first and second MTJ devices.

18 Claims, 22 Drawing Sheets

(56) References Cited

OTHER PUBLICATIONS

Ostwal et al. "A novel compound synapse using probabilistic spin-orbit-torque switching for MTJ-based deep neural networks." IEEE Journal on Exploratory Solid-State Computational Devices and Circuits 5.2: 182-187 (Year: 2019).*

Lecun, Y., Bottou, L., Bengio, Y., & Haffner, P. (1998). Gradient-based learning applied to document recognition. Proceedings of the IEEE, 86(11), 2278-2324. DOI: 10.1109/5.726791.

Y. Netzer, T. Wang, A. Coates, A. Bissacco, B. Wu, and A. Y. Ng, "Reading digits in natural images with unsupervised feature learning," in NIPS Workshop on Deep Learning and Unsupervised Feature Learning. 2011.

Toledo, T. G., Perach, B., Soudry, D., & Kvatinsky, S. (2019). Mtj-based hardware synapse design for quantized deep neural networks. arXiv preprint arXiv:1912.12636.

Simonyan, K., & Zisserman, A. (2014). Very deep convolutional networks for large-scale image recognition. arXiv preprint arXiv:1409.1556.

Y. Chen, T. Luo, S. Liu, S. Zhang, L. He, J. Wang, L. Li, T. Chen, Z. Xu, N. Sun, and O. Temam. 2014. DaDianNao: A Machine-Learning Supercomputer. In Proceedings of the 47th Annual IEEE/ACM International Symposium on Microarchitecture (MICRO-47). IEEE Computer Society, USA, 609-622. DOI:https://doi.org/10.1109/MICRO.2014.58.

Song, L., Qian, X., Li, H.H., & Chen, Y. (2017). PipeLayer: A Pipelined ReRAM-Based Accelerator for Deep Learning. 2017 IEEE International Symposium on High Performance Computer Architecture (HPCA), 541-552. DOI:10.1109/HPCA.2017.55.

Soudry D, Di Castro D, Gal A, Kolodny A, Kvatinsky S. Memristor-based multilayer neural networks with online gradient descent training. IEEE Trans Neural Netw Learn Syst. Oct. 2015;26(10):2408-21. doi: 10.1109/TNNLS.2014.2383395. Epub Jan. 14, 2015. PMID: 25594981.

I. Hubara, M. Courbariaux, D. Soudry, R. El-Yaniv, and Y. Bengio, "Quantized Neural Networks Quantized Neural Networks: Training Neural Networks with Low Precision Weights and Activations," arXiv:1609.07061, 2016.

Deng, L., Jiao, P., Pei, J., Wu, Z., & Li, G. (2018). GXNOR-Net: Training deep neural networks with ternary weights and activations without full-precision memory under a unified discretization framework. Neural Networks, 100, 49-58.

Courbariaux, M., Hubara, I., Soudry, D., El-Yaniv, R., & Bengio, Y. (2016). Binarized neural networks: Training deep neural networks with weights and activations constrained to+ 1 or−1. arXiv preprint arXiv:1602.02830.

Courbariaux, M., Bengio, Y., & David, J. P. (2015). Binaryconnect: Training deep neural networks with binary weights during propagations. Advances in neural information processing systems, 28. https://doi.org/10.48550/arXiv.1511.00363.

X. Sun, S. Yin, X. Peng, R. Liu, J. s. Seo, and S. Yu, "XNOR-RRAM: A Scalable and Parallel Resistive Synaptic Architecture for Binary Neural Networks," in 2018 Design, Automation Test in Europe Conference Exhibition (DATE), pp. 1423-1428, Mar. 2018. doi: 10.23919/DATE.2018.8342235.

S. Yu, B. Gao, Z. Fang, H. Yu, J. Kang, and H.-S. P. Wong, "Stochastic learning in oxide binary synaptic device for neuromorphic computing," Frontiers in Neuroscience, vol. 7, p. 186, 2013. doi: 10.3389/fnins.2013.00186.

A. F. Vincent, J. Larroque, N. Locatelli, N. B. Romdhane, O. Bichler, C. Gamrat, W. S. Zhao, J. O. Klein, S. Galdin-Retailleau, and D. Querlioz, Spin-Transfer Torque Magnetic Memory as a Stochastic Memristive Synapse for Neuromorphic Systems. IEEE Transactions on Biomedical Circuits and Systems, Institute of Electrical and Electronics Engineers, 2015, 9 (2), pp. 166-174. ff10.1109/TBCAS.2015.2414423ff. ffhal-01822200f.

Mondal, A., & Srivastava, A. (Jul. 2018). In-situ stochastic training of MTJ crossbar based neural networks. In Proceedings of the International Symposium on Low Power Electronics and Design (pp. 1-6). arXiv:1806.09057v1.

Ruder, S. (2016). An overview of gradient descent optimization algorithms. arXiv preprint arXiv:1609.04747.

Vincent, A. F., Locatelli, N., Klein, J. O., Zhao, W. S., Galdin-Retailleau, S., & Querlioz, D. (2014). Analytical macrospin modeling of the stochastic switching time of spin-transfer torque devices. IEEE Transactions on Electron Devices, 62 (1), 164-170. DOI: 10.1109/TED.2014.2372475.

Greenberg-Toledo, T., Mazor, R., Haj-Ali, A., & Kvatinsky, S. (2019). Supporting the momentum training algorithm using a memristor-based synapse. IEEE Transactions on Circuits and Systems I: Regular Papers, 66(4), 1571-1583. DOI: 10.1109/JPROC.2015.2503119.

Rosenthal, E., Greshnikov, S., Soudry, D., & Kvatinsky, S. (May 2016). A fully analog memristor-based neural network with online gradient training. In 2016 IEEE international symposium on circuits and systems (ISCAS) (pp. 1394-1397). IEEE. DOI:10.1109/ISCAS.2016.7527510.

H. Kubota, A. Fukushima, K. Yakushiji, S. Yakata, S. Yuasa, K. Ando, M. Ogane, Y. Ando, and T. Miyazaki , "Reduction in switching current using a low-saturation magnetization Co—Fe—(Cr, V)—B free layer in MgO-based magnetic tunnel junctions", Journal of Applied Physics 105, 07D117 (2009) https://doi.org/10.1063/1.3068484.

T. L. Gilbert, "A phenomenological theory of damping in ferromagnetic materials," in IEEE Transactions on Magnetics, vol. 40, No. 6, pp. 3443-3449, Nov. 2004, doi: 10.1109/TMAG.2004.836740.

Garcia-Palacios, J. L., & Lázaro, F. J. (1998). Langevin-dynamics study of the dynamical properties of small magnetic particles. Physical Review B, 58(22), 14937. DOI:https://doi.org/10.1103/PhysRevB.58.14937.

J. Slonczewski, "Current-driven excitation of magnetic multilayers," Journal of Magnetism and Magnetic Materials, vol. 159, No. 1, pp. L1- L7, 1996. https://doi.org/10.1016/0304-8853(96)00062-5.

D'Aquino, M., Serpico, C., Coppola, G., Mayergoyz, I. D., & Bertotti, G. (2006). Midpoint numerical technique for stochastic Landau-Lifshitz-Gilbert dynamics. Journal of applied physics, 99(8), 08B905. DOI: 10.1063/1.2169472.

Diao, Z., Li, Z., Wang, S., Ding, Y., Panchula, A.F., Chen, E., Wang, L., & Huai, Y. (2007). Spin-transfer torque switching in magnetic tunnel junctions and spin-transfer torque random access memory. Journal of Physics: Condensed Matter, 19, 165209.

Slonczewski, J. C. (1989). Conductance and exchange coupling of two ferromagnets separated by a tunneling barrier. Physical Review B Condens Matter, 39(10), 6995. DOI: 10.1103/physrevb.39.6995.

Bi, X., Li, H., & Wang, X. (2012). STT-RAM cell design considering CMOS and MTJ temperature dependence. IEEE Transactions on Magnetics, 48(11), 3821-3824. 10.1109/TMAG.2012.2200469.

X. Liu, D. Mazumdar, W. Shen, B. D. Schrag, and G. Xiao, "Thermal stability of magnetic tunneling junctions with MgO barriers for high temperature spintronics," Applied Physics Letters, vol. 89, No. 2, p. 023504, 2006. doi: 10.1063/1.2219997.

Shafiee, A., Nag, A., Muralimanohar, N., Balasubramonian, R., Strachan, J.P., Hu, M., Williams, R.S. and Srikumar, V., (2016). ISAAC: A convolutional neural network accelerator with in-situ analog arithmetic in crossbars. ACM SIGARCH Computer Architecture News, 44(3), https://doi.org/10.1145/3007787.3001139.

M. Saberi, R. Lotfi, K. Mafinezhad and W. A. Serdijn, "Analysis of Power Consumption and Linearity in Capacitive Digital-to-Analog Converters Used in Successive Approximation ADCs," in IEEE Transactions on Circuits and Systems I: Regular Papers, vol. 58, No. 8, pp. 1736-1748, Aug. 2011, doi: 10.1109/TCSI.2011.2107214.

D. Bankman, L. Yang, B. Moons, M. Verhelst and B. Murmann, "An always-on 3.8 μJ/86% CIFAR-10 mixed-signal binary CNN processor with all memory on chip in 28nm CMOS," 2018 IEEE International Solid—State Circuits Conference—(ISSCC), 2018, pp. 222-224, doi: 10.1109/ISSCC.2018.8310264.

Li, F., Zhang, B., & Liu, B. (2016). Ternary weight networks. arXiv preprint arXiv:1605.04711.

Ren, A., Li, Z., Ding, C., Qiu, Q., Wang, Y., Li, J., Qian, X., & Yuan, B. (2017). Sc-dcnn: Highly-scalable deep convolutional neural

(56) References Cited

OTHER PUBLICATIONS network using stochastic computing. ACM SIGPLAN Notices, 52(4), 405-418. arXiv:1611.05939v2.

Zhang, Y., Zhao, W., Prenat, G., Devolder, T., Klein, J. O., Chappert, C., Dieny, B. & Ravelosona, D. (2013). Electrical modeling of stochastic spin transfer torque writing in magnetic tunnel junctions for memory and logic applications. IEEE Transactions on Magnetics, 49(7), 4375-4378. doi: 10.1109/TMAG.2013.2242257.

R. Naous, M. Al-Shedivat and K. N. Salama, "Stochasticity Modeling in Memristors," in IEEE Transactions on Nanotechnology, vol. 15, No. 1, pp. 15-28, Jan. 2016, doi: 10.1109/TNANO.2015.2493960.

Schuller, I. K. and Stevens, R. Neuromorphic Computing : From Materials to Systems Architecture Report of a Roundtable Convened to Consider Neuromorphic Computing. U.S. Department of Energy, Office of Science, 2015.

J. Zhan, O. Kayiran, G. H. Loh, C. R. Das and Y. Xie, "OSCAR: Orchestrating STT-RAM cache traffic for heterogeneous CPU-GPU architectures," 2016 49th Annual IEEE/ACM International Symposium on Microarchitecture (MICRO), 2016, pp. 1-13, doi: 10.1109/MICRO.2016.7783731.

Sharad, M., Augustine, C., Panagopoulos, G., & Roy, K. (2012). Proposal for neuromorphic hardware using spin devices. arXiv preprint arXiv:1206.3227.

Cheng, M., Xia, L., Zhu, Z., Cai, Y., Xie, Y., Wang, Y., & Yang, H. (Jun. 2017). Time: A training-in-memory architecture for memristor-based deep neural networks. In 2017 54th ACM/EDAC/IEEE Design Automation Conference (DAC) (pp. 1-6). IEEE. DOI: 10.1145/3061639.3062326.

Chi, P., Li, S., Xu, C., Zhang, T., Zhao, J., Liu, Y., Wang, Y. & Xie, Y. (2016). Prime: A novel processing-in-memory architecture for neural network computation in reram-based main memory. ACM SIGARCH Computer Architecture News, 44(3), 27-39. DOI: 10.1109/ISCA.2016.13.

E. Giacomin, T. Greenberg-Toledo, S. Kvatinsky and P. Gaillardon, "A Robust Digital RRAM-Based Convolutional Block for Low-Power Image Processing and Learning Applications," in IEEE Transactions on Circuits and Systems I: Regular Papers, vol. 66, No. 2, pp. 643-654, Feb. 2019, doi: 10.1109/TCSI.2018.2872455.

Kingma, D. P., & Ba, J. (2014). Adam: A method for stochastic optimization. arXiv preprint arXiv:1412.6980.

P. Jokic, S. Emery and L. Benini, "BinaryEye: A 20 kfps Streaming Camera System on FPGA with Real-Time On-Device Image Recognition Using Binary Neural Networks," 2018 IEEE 13th International Symposium on Industrial Embedded Systems (SIES), 2018, pp. 1-7, doi: 10.1109/SIES.2018.8442108.

CS231n: Convolutional Neural Networks for Visual Recognition Spring 2017. (2017). CS231n: Convolutional Neural Networks for Visual Recognition Spring 2017. Retrieved Feb. 22, 2022, from http://cs231n.stanford.edu/2017/.

Artificial Intelligence Computing Leadership from NVIDIA. (2017). NVIDIA. Retrieved Feb. 22, 2022, from https://www.nvidia.com/en-us/.

S. Greshnikov, E. Rosenthal, D. Soudry, and S. Kvatinsky, "A Fully Analog Memristor-Based Multilayer Neural Network with Online Backpropagation Training," IEEE International Conference on Circuits and Systems, May 2016.

\* cited by examiner

MTJ-BASED HARDWARE SYNAPSE IMPLEMENTATION FOR BINARY AND TERNARY DEEP NEURAL NETWORKS

CROSS-REFERENCE TO RELATED APPLICATIONS

This application claims the benefit of priority of U.S. Provisional Patent Application No. 62/943,887, filed on Dec. 5, 2019, the contents of which are incorporated by reference as if fully set forth herein in their entirety.

FIELD OF THE INVENTION

The subject matter disclosed herein relates to the field of neural networks and more particularly relates to a magnetic tunnel junction (MTJ) based hardware synapse implementation for binary and ternary deep neural networks.

BACKGROUND OF THE INVENTION

Deep neural networks (DNNs) are the state-of-the-art solution for a wide range of applications, such as image and natural language processing. Classical DNNs are compute-intensive, i.e., they require numerous multiply and accumulate (MAC) operations with frequent memory accesses. As such, DNN performance is limited by computing resources and available power. Working with DNNs is composed of two stages: training and inference, when the computation complexity of training exceeds the inference. Both the training and inference stages in DNNs are usually executed by commodity hardware (e.g., mostly FPGA and GPU platforms), but effort has been devoted to developing dedicated hardware, optimized for executing DNN tasks. The two main approaches to accelerate DNN execution are: (1) to move the computation closer to the memory, and (2) improving the performance of the MAC operation.

Efforts have been made to design dedicated hardware for DNNs. Current DNN models, however, are power hungry and not suited to run on low power devices. Therefore, discrete neural networks, such as ternary and binary neural network (TNNs, BNNs), are being explored as a way to reduce the computational complexity and memory consumption of DNNs. By reducing the weights and activation function resolution to binary $\{-1, 1\}$ or ternary $\{-1, 0, 1\}$ values, the MAC operations in discrete neural networks are replaced by much less demanding logic operations, and the number of required memory accesses is significantly reduced. This insight triggered recent research efforts to design novel algorithms that can support binary and/or ternary DNNs without sacrificing accuracy. Recently, the GXNOR algorithm for training discrete neural networks, especially for TNNs and BNNs was proposed. This algorithm uses a stochastic update function to facilitate the training phase. This algorithm does not need to keep the full value (e.g., floating point) of the weights and activations.

A disadvantage of the large data structures associated with prior art synapse and activations is that they cause (i) frequent memory accesses due to memory-computation separation of von Neumann based solutions with digital CMOS MAC operations resulting in high power consumption and increased execution latency, and (ii) non-practical on-chip memory capacity (at least tens of MBs).

In addition, digital MAC circuits are computation intensive while supporting the GXNOR algorithms requires a stochastic step engine design that is difficult to implement in standard digital logic.

The foregoing examples of the related art and limitations related therewith are intended to be illustrative and not exclusive. Other limitations of the related art will become apparent to those of skill in the art upon a reading of the specification and a study of the figures.

SUMMARY OF THE INVENTION

The following embodiments and aspects thereof are described and illustrated in conjunction with systems, tools and methods which are meant to be exemplary and illustrative, not limiting in scope.

There is provided, in an embodiment, a synapse device comprising: first and second magnetic tunnel junction (MTJ) devices, wherein each of the MTJ devices has a fixed layer port and a free layer port, and wherein the fixed layer ports of the first and second MTJ devices are connected to each other; a first control circuit connected to the free layer port of the first MTJ device and configured to provide a first control signal; and a second control circuit connected to the free layer port of the second MTJ device and configured to provide a second control signal; wherein the first and second control circuits are configured to perform a gated XNOR (GXNOR) operation between a synapse value and activation values; and wherein an output of the GXNOR is represented by a sum of the output currents through both of the first and second MTJ devices.

In some embodiments, the synapse device is configured to store a ternary or binary synapse weight represented by a state of the MTJ devices.

In some embodiments, the synapse weight is defined as and stored as a combination of respective resistance values of each of the first and second MTJ devices.

In some embodiments, the synapse device is further configured to perform in-situ stochastic update of the ternary or binary synapse weights.

There is also provided, in an embodiment, an array of synapse devices comprising: a plurality of synapse devices arranged in an array of rows and columns, wherein each of the synapse devices comprises: first and second magnetic tunnel junction (MTJ) devices, wherein each of the MTJ devices has a fixed layer port and a free layer port, and wherein the fixed layer ports of the first and second MTJ devices are connected to each other, a first control circuit connected to the free layer port of the first MTJ device and configured to provide a first control signal, and a second control circuit connected to the free layer port of the second MTJ device and configured to provide a second control signal, wherein the first and second control circuits are configured to perform a gated XNOR (GXNOR) operation between synapse and activation values; and wherein an output of the GXNOR is represented by the output current through both of the first and second MTJ devices, wherein all of the synapse devices arranged in any one of the columns share an input voltage, wherein all of the synapse devices arranged in any one of the rows share the first and second control signals, and wherein outputs of all of the synapse devices arranged in any one of the rows are connected.

In some embodiments, each of the synapse devices is configured to store ternary or binary synapse weights represented by a state of the MTJ devices.

In some embodiments, the synapse weight is defined as and stored as a combination of respective resistance values of each of the first and second MTJ devices.

In some embodiments, each of the synapse devices is further configured to perform in-situ stochastic update of the ternary or binary synapse weights.

In some embodiments, the array forms a trainable neural network.

In some embodiments, the neural network represents a synaptic weight matrix comprising all of the synapse weights of each of the synapse devices in the array.

In some embodiments, an output vector of the neural network is calculated as a weighted sum of all of the input voltages multiplied by the synaptic weightings matrix.

There is further provided, in an embodiment, a method comprising: providing an array of synapse devices arranged in rows and columns, wherein each of the synapse devices comprises: first and second magnetic tunnel junction (MTJ) devices, wherein each of the MTJ devices has a fixed layer port and a free layer port, and wherein the fixed layer ports of the first and second MTJ devices are connected to each other, a first control circuit connected to the free layer port of the first MTJ device and configured to provide a first control signal, and a second control circuit connected to the free layer port of the second MTJ device and configured to provide a second control signal, wherein the first and second control circuits are configured to perform a gated XNOR (GXNOR) operation between synapse and activation values, and wherein an output of the GXNOR is represented by the output current through both of the first and second MTJ devices, wherein all of the synapse devices arranged in any one of the columns share an input voltage, wherein all of the synapse devices arranged in any one of the rows share the first and second control signals, and wherein outputs of all of the synapse devices arranged in any one of the rows are connected; and at a training stage, training the array of synapse devices by: (i) inputting all of the input voltages associated with each of the columns, (ii) setting the first and second control signals associated with each of the rows to perform the GXNOR operation, and (iii) calculating an output vector of the array as a weighted sum of the input voltages multiplied by a synaptic weightings matrix comprising synapse weights of all of the synapse devices in the array.

In some embodiments, the training further comprises comparing the output vector to a training dataset input, wherein the comparing leads to an adjustment of the synaptic weightings matrix.

In some embodiments, each of the synapse devices is configured to store the synapse weight represented by a state of the MTJ devices, wherein the synapse weight is ternary or binary.

In some embodiments, the synapse weight is defined as and stored as a combination of respective resistance values of each of the first and second MTJ devices.

In some embodiments, each of the synapse devices is further configured to perform in-situ stochastic update of the ternary or binary synapse weights.

In some embodiments, the array forms a trainable neural network.

In some embodiments, the neural network represents the synaptic weight matrix comprising all of the synapse weights of each of the synapse devices in the array.

In some embodiments, the output vector of the neural network is calculated as a weighted sum of all of the input voltages multiplied by the synaptic weightings matrix.

There is further provided, in an embodiment, a computer memory structure comprising: a plurality of synapse devices, each comprising: first and second magnetic tunnel junction (MTJ) devices, wherein each of the MTJ devices has a fixed layer port and a free layer port, and wherein the fixed layer ports of the first and second MTJ devices are connected to each other, a first control circuit connected to the free layer port of the first MTJ device and configured to provide a first control signal, and a second control circuit connected to the free layer port of the second MTJ device and configured to provide a second control signal, wherein the first and second control circuits are configured to perform a gated XNOR (GXNOR) operation between a synapse value and activation values; and wherein an output of the GXNOR is represented by a sum of the output currents through both of the first and second MTJ devices.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION OF THE INVENTION

Figure 1:
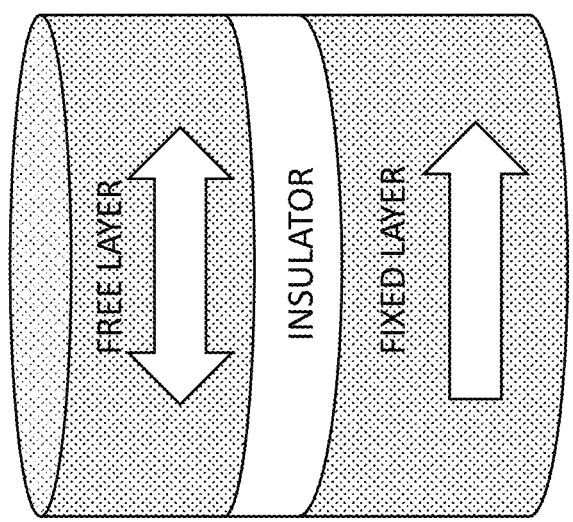
FIG. 1 shows an MTJ device composed of two ferromagnetic layers, a fixed magnetization layer and a free magnetization layer, separated by an insulator layer.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

In some embodiments, the present disclosure provides for a novel MTJ-based synapse circuit. In some embodiments, the present MTJ-based synapse circuit may be employed in a neural network, and especially a TNN and/or a BNN, which may be trained without sacrificing accuracy. The proposed MTJ-based synapse circuit enables in-situ, highly parallel and energy efficient execution of weight-related computation. Such a circuit can accelerate TNN inference and training execution on low-power devices, such as IoT and consumer devices.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Disclosed herein are a memory device and an associated method. While the following description will be described in terms of memory synaptic devices for clarity and placing the invention in context, it should be kept in mind that the teachings herein may have broad application to all types of systems, devices and applications.

A synapse is an active memory element, which may include a bi-polar memory element having polarity-dependent switching.

In some embodiments, the present disclosure provides for a stochastic synapse for use in a neural network. In some embodiments, a stochastic synapse of the present disclosure comprises magnetic tunnel junction (MTJ) devices, wherein each of the MTJ devices has a fixed layer port and a free layer port, and wherein the fixed layer ports of the MTJ devices are connected to each other. In some embodiments, control circuits operationally connected to the MTJ devices are configured to perform a gated XNOR operation between synapse and activation values, wherein an output of the gated XNOR is represented by the output current through both of the MTJ devices.

Quantized neural networks are being actively researched as a solution for the computational complexity and memory intensity of deep neural networks. This has sparked efforts to develop algorithms that support both inference and training with quantized weight and activation values without sacrificing accuracy. A recent example is the GXNOR framework for stochastic training of ternary and binary neural networks. Further reduction of the power consumption and latency can be obtained by designing dedicated hardware for parallel, in-situ execution of those algorithms with low power consumption.

Accordingly, in some embodiments, the present disclosure provides for a novel hardware synapse circuit that uses magnetic tunnel junction (MTJ) devices to support GXNOR training methods.

As noted above, binary neural networks (BNNs) and ternary neural networks (TNNs) are being explored as a way to reduce the computational complexity and memory footprint of DNNs. By reducing the weight resolution and activation function precision to quantized binary $\{-1,1\}$ or ternary $\{-1,0,1\}$ values, the MAC operations are replaced by much less demanding logic operations, and the number of required memory accesses is significantly reduced. Such networks are also known as quantized neural networks (QNNs). This insight triggered recent research efforts to design novel algorithms that can support binary and/or ternary DNNs without sacrificing accuracy.

The GXNOR algorithm for training networks uses a stochastic update function to facilitate the training phase. Unlike other algorithms, GXNOR does not require keeping the full value (e.g., in a floating point format) of the weights and activations. Hence, GXNOR enables further reduction of the memory capacity during the training phase.

Emerging memory technologies such as Spin-Transfer Torque Magnetic Tunnel Junction (STT-MTJ) can be used to design dedicated hardware to support in-situ DNN training, with parallel and energy efficient operations. Furthermore, the near-memory computation enabled by these technologies reduces overall data movement.

An MTJ is a binary device with two stable resistance states. Switching the MTJ device between resistance states is a stochastic process, which may limit the use of STT-MTJ device as a memory cell.

Accordingly, in some embodiments, the stochastic behavior of the MTJ is used to support GXNOR training.

In some embodiments, the present disclosure provides for an MTJ-based synapse circuit comprising, e.g.:

A four-transistor two-MTJ (4T2R) circuit for a ternary stochastic synapse, and a two-transistor single-MTJ (2T1R) circuit for a binary stochastic synapse, where the intrinsic stochastic switching behavior of the MTJ is used to perform the GXNOR stochastic update function. In some embodiments, the present disclosure provides for a highly parallel and energy efficient accurate in-situ computation. In some embodiments, a synapse of the present disclosure can support various DNN optimization algorithms, such as SGD and ADAM, which are used regularly in practical applications.

The present inventors have evaluated TNN and BNN training using the MTJ-based synapse of the present disclosure over provided datasets. The results show that using the MTJ-based synapse for training yielded similar results as an ideal GXNOR algorithm, with a small accuracy loss of 0.7% for the TNN and 2.4% for the BNN. Moreover, the proposed hardware design is energy efficient, achieving $$18.3 \frac{TOPs}{W}$$

for feedforward and $$3 \frac{TOPs}{W}$$

for weight update.

Magnetic Tunnel Junction (MTJ) Device

An MTJ device is composed of two ferromagnetic layers, a fixed magnetization layer and a free magnetization layer, separated by an insulator layer, as shown in FIG. 1. The resistance of the device is defined by the relative magnetization of the free layer as compared to the fixed layer. A parallel magnetization state (P) leads to low resistance (Ron) and an anti-parallel state (AP) leads to high resistance (Roff). The device resistance can be switched by the current flow through the device. The switching probability of the MTJ device depends on the current, when three work regimes are defined: (1) low current; (2) intermediate current; and (3) high current. Switching is a stochastic process. These three regimes are defined by the critical current, given by $$I_{c_0} = \frac{2|e|}{\hbar} \frac{\alpha V(1 \pm P)}{P} \mu_0 M_s \frac{M_{eff}}{2}, \tag{1}$$

where $\alpha$, $M_s$, V, P, $M_{eff}$ are the Gilbert damping, the saturation magnetization, the free layer volume, the spin polarization of the current, and the effective magnetization, respectively.

In a low current regime where $I \ll I_{c_0}$, the probability of switching is given by $$P_{sw} = 1 - exp\left(-\frac{\Delta t}{\langle \tau \rangle}\right) \tag{2a}$$

where $\langle \tau \rangle$ is the mean switching time, and $\Delta t$ is the write duration. Due to the exponential dependency on the current value, denoted by $\langle \tau \rangle$, long write periods are needed to reach high switching probabilities ($P_{sw} \rightarrow 1$).

In the high current regime where $I \gg I_{c_0}$, the switching time is $$\tau = \frac{2}{\alpha \gamma \mu_0 M_s} \frac{I_{c_0}}{I - I_{c_0}} \log\left(\frac{\pi}{2|\theta|}\right), \tag{2b}$$

where $\gamma$ is the gyromagnetic ratio, and $\theta$ is the initial magnetization anglE, given by a normal distribution $\theta \sim \mathcal{N}(0, \theta_0)$, $\theta_0 = \sqrt{k_B T/(\mu_0 H_k M_s V)}$, where $H_k$ is the shape anisotropy field.

Unlike the high- and low-current regimes, which can be described by an analytic model, the intermediate current regime has no simple model that describes it. The low-current regime exhibits long switching time ($\langle \tau \rangle \gg ns$) which limits its practical use for computation. Therefore, in some embodiments, the present invention focuses on the high current regime.

The Gated XNOR (GXNOR) Algorithm for Discrete Neural Networks

In recent years, efforts have been made to make DNN models more efficient and hardware-compatible. Compression methods have been explored, where the DNN weights and activations are constrained to discrete values such as binary $\{-1, 1\}$ or ternary $\{-1, 0, 1\}$.

Figure 2:
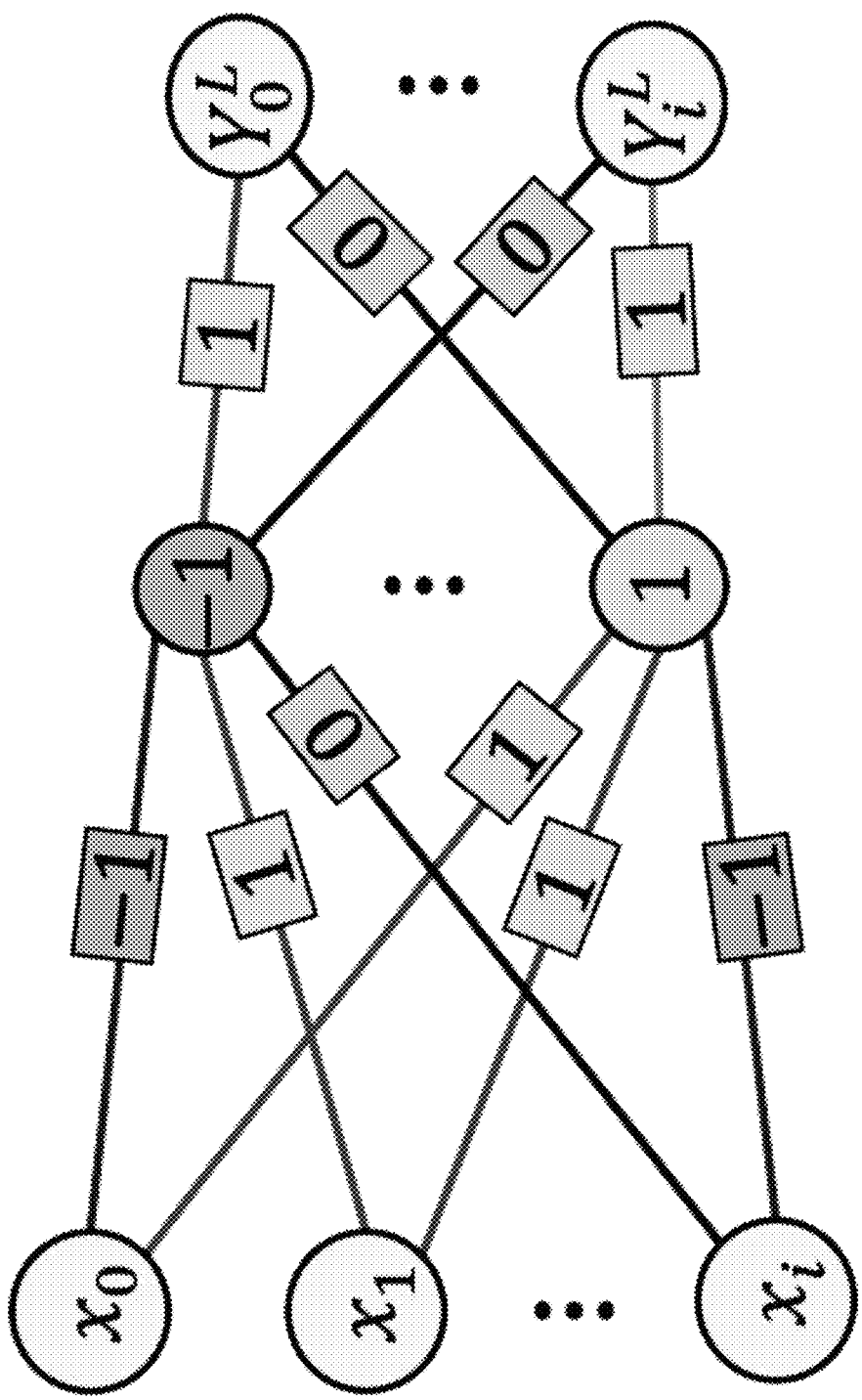
FIG. 2 shows an example GXNOR neural network.

Recently, a framework for constraining the weights and activations to the discrete space was suggested. Compared to other state-of-the-art algorithms, GXNOR eliminates the need for saving the full-precision weight values during the network training. The MAC operations in TNNs and BNNs are replaced with simple logic operations, i.e., XNOR, and the network's memory footprint is reduced dramatically. The GXNOR algorithm is a framework for constraining the weights and activations to the quantized space while training the network. An example GXNOR neural network is shown in FIG. 2.

Quantized Weights and Activations

The quantized space is defined by $$Z_N = z_N^n \mid z_N^n = \left(\frac{n}{2^{N-1}} - 1\right), \quad n = 0, 1 \ldots, 2^N, \tag{3}$$

where N is a non-negative integer which defines the space values and $z_N^n \in [-1, 1]$. For example, the binary space is given for N=0 and the ternary space for N=1. The quantized space resolution, the distance between two adjacent states, is given by $$\Delta z_N = \frac{1}{2^{N-1}} \tag{4}$$

Feedforward

The quantized activation is a step function, where the number of steps is defined by the space. To support back-propagation through the quantized activations, the derivative of the activation function is approximated. Accordingly, in some embodiments, a simple window function may be used which replaces the ideal derivative, given by a sum of delta functions.

Figure 3:
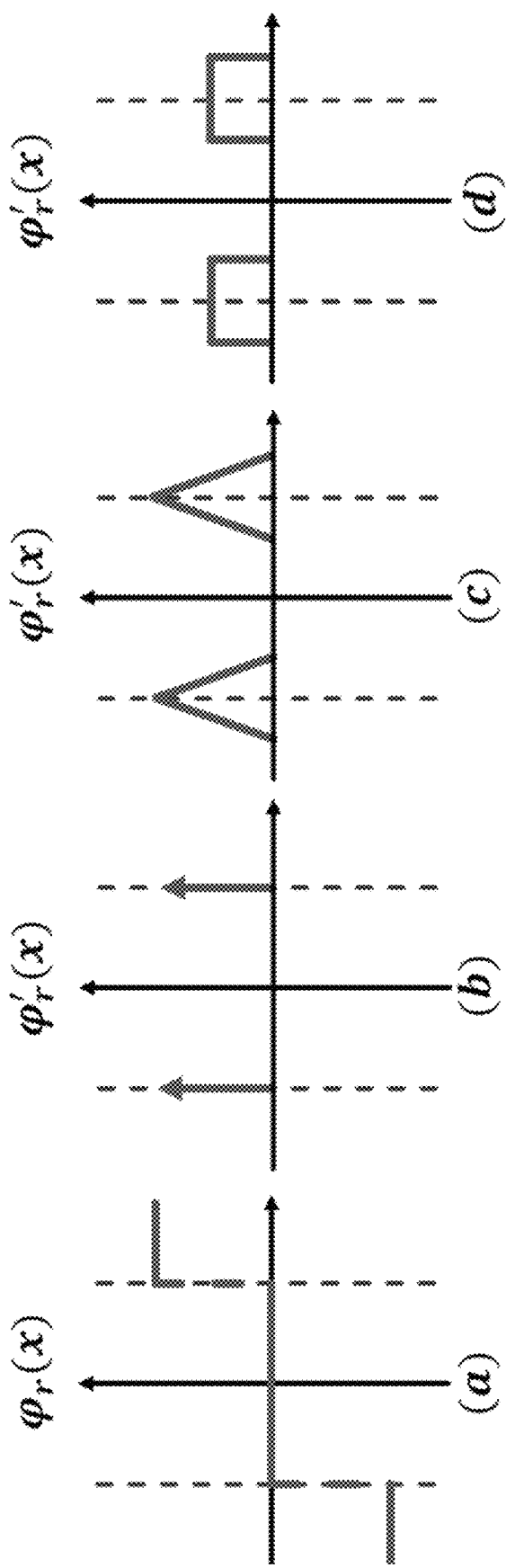
FIG. 3 shows a GXNOR network the activation functions.

In GXNOR networks, the activation function (FIG. 3(a)) is replaced by an estimate of the derivative (FIGS. 3(b), 3(c), and 3(d)).

To support training with weights which are constrained to the discrete weight space (DWS), the GXNOR algorithm uses a stochastic gradient based method to update the weights. First, a boundary function must be defined to guarantee that the updated value will not exceed the [−1, 1] range.

In some embodiments, the boundary function is $$\varrho(\Delta W_{ij}^l(k)) = \begin{cases} \min(1 - W_{ij}^l(k), \Delta W_{ij}^l(k)), & \text{if } \Delta W_{ij}^l(k) > 0, \\ \max(-1 - W_{ij}^l(k), \Delta W_{ij}^l(k)), & \text{else} \end{cases} \quad (5)$$

where is the synaptic weight between neuron j and neuron i of the following layer (l+1), $\Delta W_{ij}^l$ is the gradient based update value, and k is the update iteration. Then, the update function is $$W_{ij}^l(k+1) = W_{ij}^l(k) + \Delta w_{ij}^l(k), \quad (6)$$

where $\Delta w_{ij}^l(k) = \mathcal{P}(\varrho(\Delta W_{ij}^l(k))) \in \mathbb{Z}$ is the discrete update value, obtained by projecting $\varrho(\Delta W_{ij}^l(k))$ to a quantized weight space. $\mathcal{P}(\varrho)$ is a probabilistic projection function defined by $$\mathcal{P}(\varrho) = \begin{cases} \kappa_{ij}\Delta z_N + \text{sign}(\varrho)\Delta z_N, & w.p. \tau(v_{ij}), \\ \kappa_{ij}\Delta z_N, & w.p. 1 - \tau(v_{ij}) \end{cases}, \quad (7)$$

where $\kappa_{ij}$ and $v_{ij}$ are, respectively, the quotient and the remainder values of $\varrho(\Delta W_{ij}(k))$ divided by $\Delta z_N$, and $$\tau(v) = \tanh\left(m \cdot \frac{|v|}{\Delta z_N}\right), \tau(v) \in [0, 1], \quad (8)$$

where m is a positive adjustment factor. Hence, $$\Delta w_{ij}^l = \kappa_{ij}\Delta z_N + \text{sign}(v_{ij})\text{Bern}(\tau(v_{ij}))\Delta z_N, \quad (9)$$

where $\text{Bern}(\tau(v_{ij}))$ is a Bernoulli variable with parameter $\tau(v_{ij})$.

Figure 4:
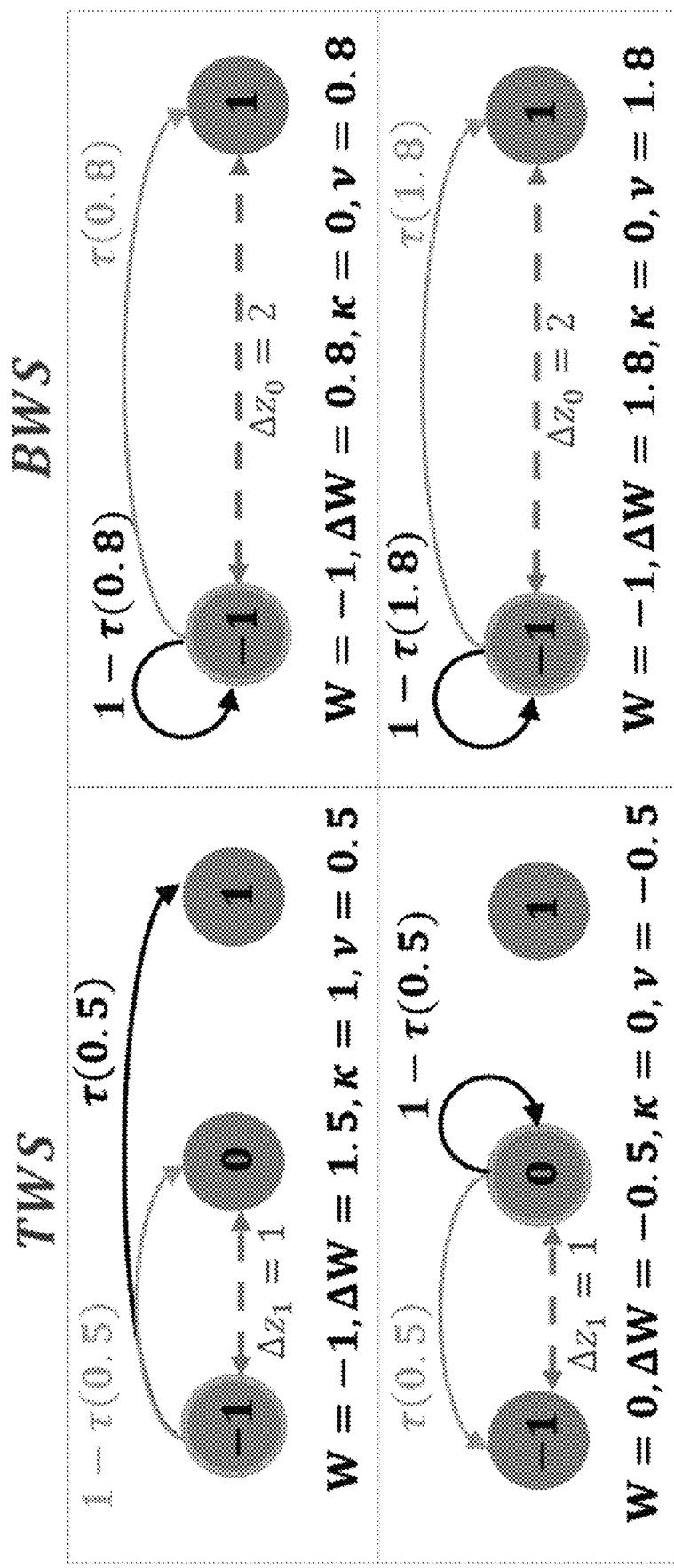
FIG. 4 illustrates examples of TNN and BNN weight update, according to some embodiments of the present disclosure.

In some embodiments, the present disclosure focuses on TNNs and BNNs. The binary weight space (BWS) is given by N=0 and $\Delta z_0$=2. The ternary weight space (TWS) is given by N=1 and $\Delta z_1$=1. FIG. 4 illustrates examples of TNN and BNN weight update for W=−1 and W=0. In FIG. 4: TNN examples (TWS): Ternary weight update with $\Delta z$=1. Given W=1 and $\Delta W$=1.5, $\kappa$=1, v=0.5 and the discrete update value is $\Delta w^l$=1+Bern($\tau$(0.5)). For W=0 and $\Delta W$=0.5, $\kappa$=0, v=0.5 and the discrete update value is $\Delta w^l$=Bern($\tau$(0.5)). BNN examples (BWS): Binary weight update with $\Delta z$=2. For W=1 and $\Delta W$=0.8, $\kappa$=0, v=0.8 and the discrete update value is $\Delta w^l$=Bern($\tau$(0.8)). Given W=1 and $\Delta W$=1.8, $\kappa$=0, V=1.8 and the discrete update value is $\Delta w^l$=Bern($\tau$(1.8)).

MTJ-Based Ternary Synapses

In some embodiments, the present disclosure provides for a ternary synapse circuit to support stochastic GXNOR training. In some embodiments, the stochastic behavior of the MTJ device may be leveraged to support the stochastic update function.

Synapse Circuit and Synapse Array

Figure 5:
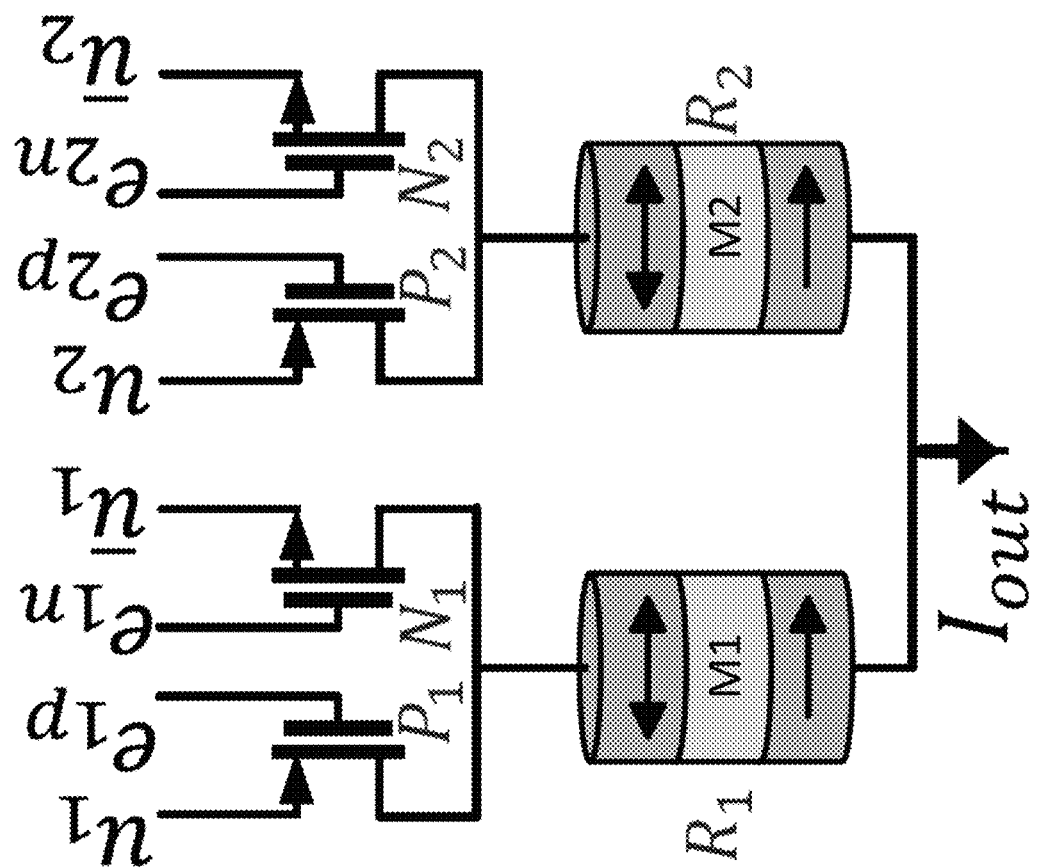
FIG. 5 shows a schematic of the four-transistor two-MTJ (4T2R) MTJ-based synapse of the present disclosure, according to some embodiments of the present disclosure.

FIG. 5 shows a schematic of the four-transistor two-MTJ (4T2R) MTJ-based synapse of the present disclosure. The ternary synapse circuit is composed of two MTJ devices, connected together in their fixed layer port. The free layer port of each connected to two access transistors on the free layer port and connected to the other MTJ device at the fixed layer port as shown in FIG. 5. A synapse is formed from two MTJ devices including a total of four transistors and two MTJ devices (i.e. memristors). The left device $M_1$ is considered positive and the right device $M_2$ is considered negative. Note that this assignment is arbitrary and may be flipped if desired.

Table 1 below lists the different values of the synapse weight, W. This weight is defined and stored as the combination of the two resistances of the MTJ devices. The zero state in the present ternary synapse has two representations, as opposed to one in a regular ternary synapse. Moreover, thanks to the bi-stability of the MTJ, the proposed synapse value is limited to {−1,0,1}; thus, the boundary function in (5) is enforced by the hardware synapse.

Figure 6A:
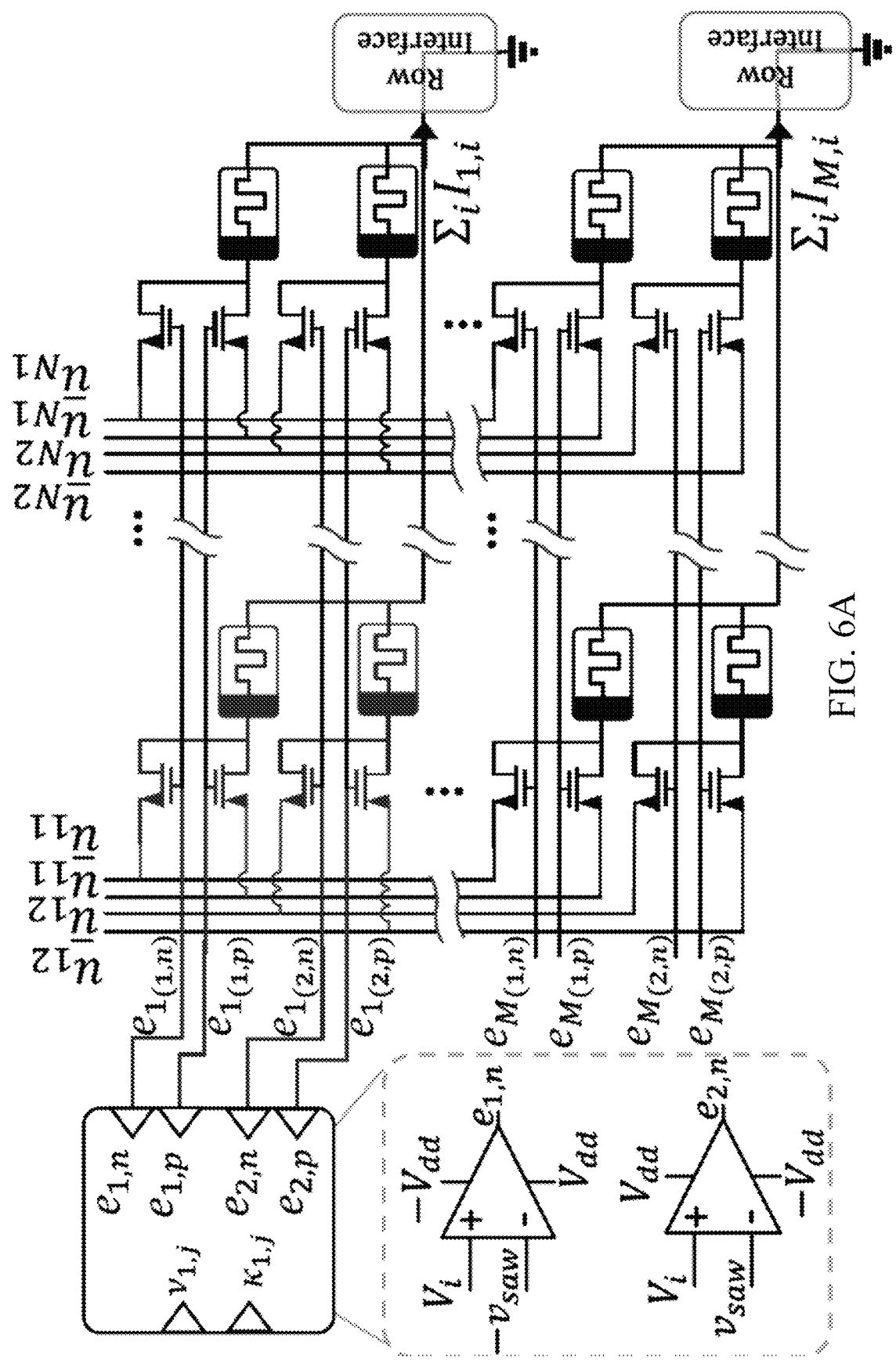
FIGS. 6A-6B show a synapse circuit comprising an array structure or the present disclosure, according to some embodiments of the present disclosure.

The synapse circuits are the basic cells of an array structure, as shown in FIG. 6A. The input voltages are shared among all synapses in the same column. Likewise, the control signals are shared among all synapses in the same row. The outputs of the synapses are connected to the same row line. The operations on the synapse array are done in the analog domain, accumulated according to Kirchoff's current law (KCL), where the GXNOR output is represented by the current.

TABLE 1

Ternary Synapse States and Output Current

| Weight | $R_1$ | $R_2$ | $I_{out}$ |
|---|---|---|---|
| 1 | $R_{on}$ | $R_{off}$ | $\frac{R_{off} - R_{on}}{R_{off}R_{on}}u$ |
| $0_s$ | $R_{off}$ | $R_{off}$ | 0 |
| $0_w$ | $R_{on}$ | $R_{on}$ | 0 |
| −1 | $R_{off}$ | $R_{on}$ | $-\frac{R_{off} - R_{on}}{R_{off}R_{on}}u$ |

As described in Table 1 above, the synapse state is defined and stored as the combination of the MTJ resistances. $R_1$ represents the resistance of MTJ device $M_1$ (FIG. 5) and $R_2$ represents the resistance of MTJ device $M_2$, $R_{on}$, represents low impedance and $R_{off}$ represents high impedance. Note that unlike a regular ternary synapse, the zero state has two representations: $0_s$ represents strong 0 and $0_w$ represents weak 0. Moreover, due to the bi-stability of the MTJ, the proposed synapse value is limited to 1,0,1; thus, the boundary function (5) is not required when this hardware synapse is used. The value of input voltage source, u, is set according to the operation and it can be set to logic +1, 0, 1.

During feedforward (i.e., inference) operation $u_1$ and $u_2$ represent the value of the activation function. Note that $u_1$ and $u_2$ can be {−1, 0, 1}, for ternary activations, as well as {−1, 1} for binary activations. Note also that {1, 0, 1} and {1, 1} represent logic values. In the circuit implementation {−1,0,1}={−$V_{rd}$,0,$V_{rd}$} $V_{rd} \leq I_{c0}R_{on}$, to ensure that the MTJ does not change its resistance during the feed forward operation mode.

During backpropagation, specifically during the update operation, the weights are updated according to an error function. $u_1$ and $u_2$ are fixed to the values +1 and −1, respectively. An update value of zero indicates that the weight already stored in the synapse does not change.

As shown in FIG. 6A, the synapse circuits are the basic cells for a synapse array structure, where N represents the number of columns and M the number of rows. The input voltages $u_1$, $\overline{u_1}$, $u_2$, and $\overline{u_2}$ are shared among all synapses in the same column. Likewise, the control signals $e_{1p}$, $e_{1n}$, $e_{2p}$, and $e_{2n}$ are shared among all synapses in the same row. The outputs of the synapses are connected to the same row line. The operation on the synapse array is done in analog regime; thus, the GXNOR results are computed accumulated according to Kirchhoff's current law (KCL), where the GXNOR output is represented by the current. In update operation, the entire column is written to as a whole with each synapse cell receiving a different value in accordance with the control signals $e_{1p}$, $e_{1n}$, $e_{2p}$, and $e_{2n}$ connected to the synapses in each row.

Training TNN
Gated XNOR and Feedforward

To perform the gated-XNOR logic operation between the synapse and activation values, the input neuron values are denoted as the voltage sources. The logic values $\{-1,0,1\}$ are represented by u ∈ $\{-V_{rd}, 0, V_{rd}\}$, where $V_{rd}$ is set to guarantee the low current regime of an MTJ, so the switching probability is negligible. During this operation, $u_1=u$ and $\overline{u_2}=-u$ are connected. The result is the output current sign, $$I_{out}=(G_1-G_2)u, \quad (10)$$

where $G_{\{1,2\}}$ are the conductance of the two MTJs. As listed in Table 1 above, the polarity of $I_{out}$ depends on the input voltage and the synapse weight. If u=0 or W=$\{0_w, 0_s\}$, the output current is $I_{out}\approx 0$. If the weight and input have the same polarity, then sign($I_{out}$)=1 else sign($I_{out}$)=-1.

To perform feedforward with the GXNOR operation, the row output is connected to ground potential and the output currents from all synapses are summed based on KCL. Thus, the current through row i is $$I_{row,i} = \sum_{j=1}^{M} (G_{ij,R_1} - G_{ij,R_2})u_j = \frac{R_{off} - R_{on}}{R_{off} R_{on}} (M_{+1,i} - M_{-1,i}) V_{rd}, \quad (11)$$

where $G_{j,R_{\{1,2\}}}$ is the conductivity of each MTJ, M is the number of synapses per row, $M_{+1,i}$ is the total number of positive products in row i, and $M_{-1,i}$ is the total number of negative products in row i.

Weight Update

In some embodiments, in order to support DNN training, the present disclosure provides for a synaptic array which supports various optimization algorithms such as SGD, momentum, Adagrad and ADAM. These algorithms differ in the type and number of operations, where a higher level of parallelism can be achieved for SGD.

In some embodiments, the present disclosure provides for two weight update schemes, one which supports SGD and another which can support more sophisticated gradient-based optimization algorithms such as ADAM. In both schemes the update is done in the high current domain, guaranteed by the update input voltage $V_{up}$, for the update period marked by $T_{up}$. The weight update is influenced by the current direction and the time interval in which the current flows through the MTJs.

Time Interval

The row control signal, $e_{i,j}$, connects the MTJ to one of the voltage sources $\{u_i, \overline{u_i}\}$ per update operation, for time interval $\Delta t$. Hence, an input voltage pulse $u=\pm V_{up}$ is applied to the MTJ, with pulse width $\Delta t \in [0, T_{up}]$. Therefore, using (2a), the switching probability of each MTJ is $$P_{sw} = P(\Delta t > \tau) = 1 - \text{erf}\left(\frac{\pi}{2\sqrt{2}\,\theta_0 \exp\left(\frac{\Delta t V up}{CR}\right)}\right), \quad (12)$$

where $$C = \frac{2I_{c0}}{\alpha\gamma\mu_0 M_s},$$

and R is the resistance of the device. The update period, $T_{up}$, and $V_{up}$ are set to ensure that if $\Delta t = T_{up}$ then $P_{sw} \approx 1$. To update the MTJ with respect to a given real value λ, the pulse width is set to $\Delta t = \min(|\lambda|T_{up}, T_{up})$. Thus, $P_{sw}$ is a function of λ.

Current Direction

The control signals select the current direction through the synapses, as a function of sign(λ). For λ>0 (λ<0), $\{u_1, \overline{u_2}\}$ ($\{\overline{u_1}, u_2\}$) are connected; thus, the current flows from $R_1$ ($R_2$) to $R_2$ ($R_1$).

Support of General Optimization Algorithms

Figure 7A:
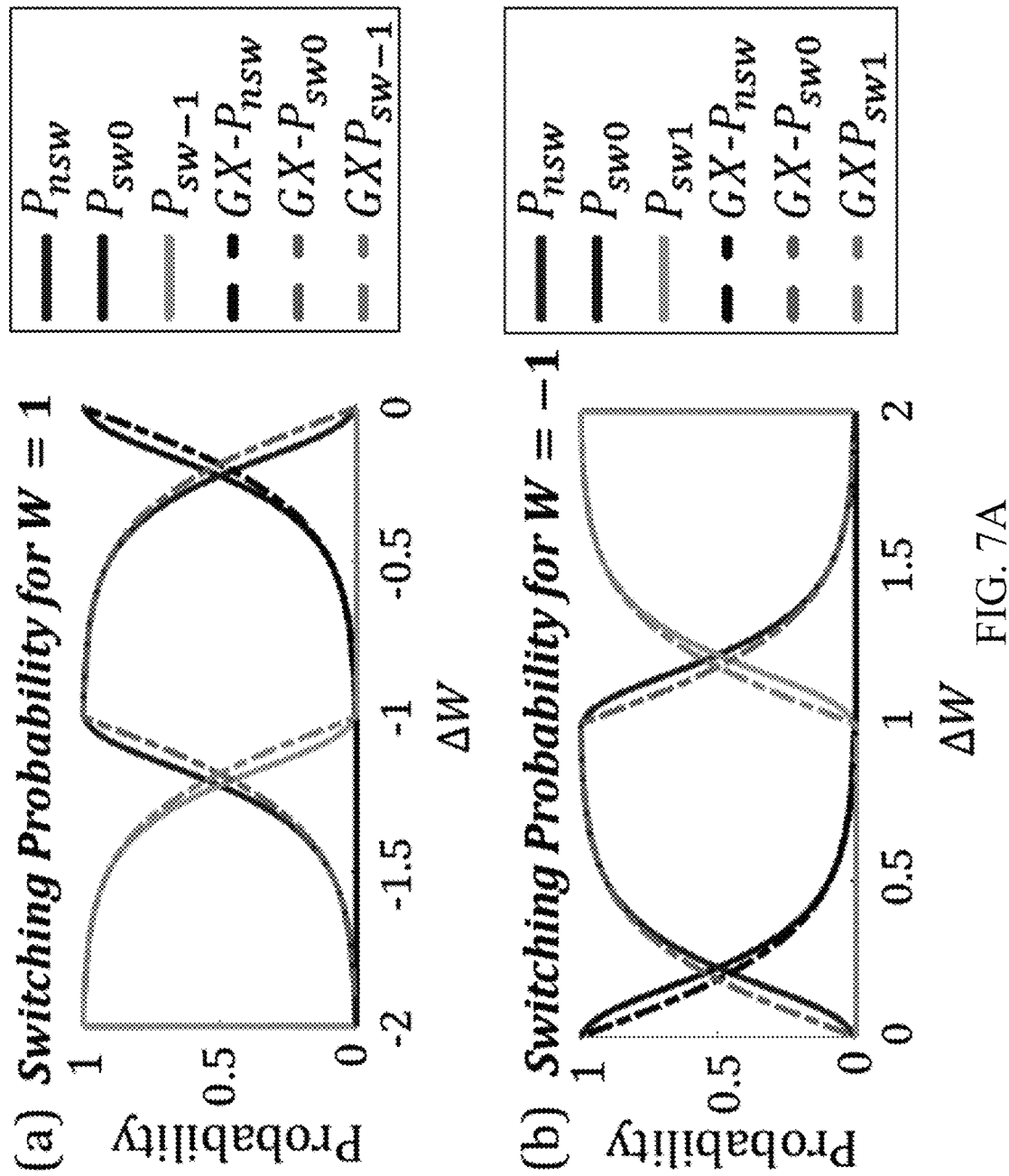
FIGS. 7A-7B illustrate a synapse switching probability, according to some embodiments of the present disclosure.
Figure 7B:
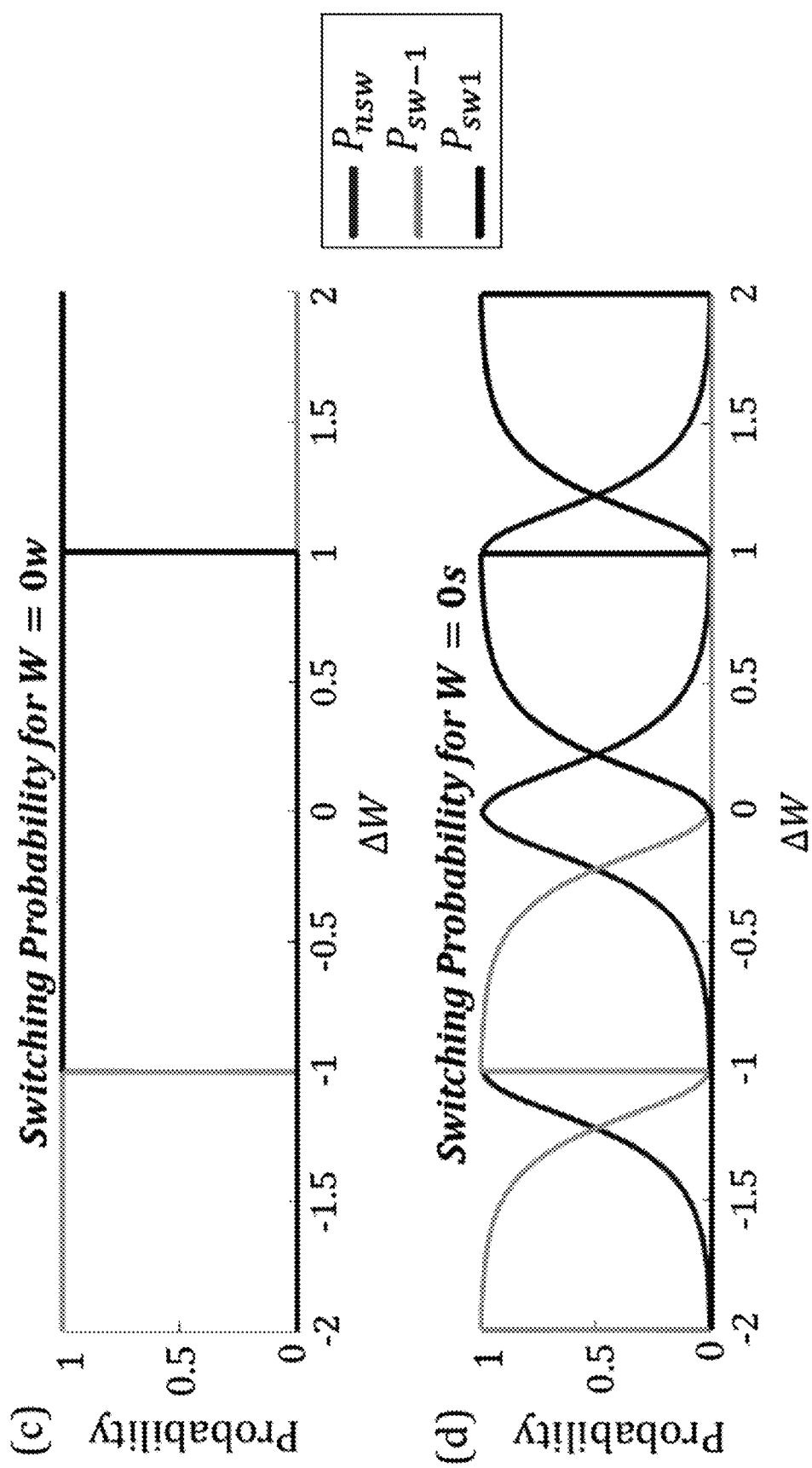

To support advanced optimization algorithms, the weight columns are updated iteratively, i.e., a single synapse array column is updated at each iteration. During this operation, the input voltages are set to $u_1=u_2=V_{up}>0$ for all the synapses. To support the probabilistic projection, the MTJ is updated proportionally to $\kappa_{ij}=*\Delta W_{ij}$ and $v_{ij}$=Remainder ($\Delta W_{ij}$), meaning that for a single synapse, one MTJ is updated using a pulse width of $\Delta t = |\kappa_{ij}|T_{up}$ and the other with $\Delta t = |v_{ij}|T_{up}$. It is assumed that the κ and v data are inputs to the synapse array. Using this work scheme, the synapse weight is updated as follows. $\kappa_{ij}$ is an integer, so if $\kappa_{ij}\neq 0$, then the MTJ switching probability is approximately 1 and can be described as an indicator variable sign($\kappa_{ij}$)$1_{\kappa\neq 0}$. $v_{ij}$ is a fraction, so the switching probability of the MTJ with respect to $v_{ij}$ is a Bernoulli variable with probability $P_{sw}(v_{ij})$. Thus, the MTJ-based synapse update is given by $\Delta w_{ij}$=sign($\Delta W_{ij}$)($1_{\kappa\neq 0}$+Bern($P_{sw}(v_{ij})$)). FIGS. 7A-7B illustrates the synapse switching probability. Ternary synapse switching probability as a function of ΔW. P and GX-P are the switching probabilities of the MTJ-based implementation and the ideal GXNOR algorithm, respectively. The probability of no weight update is marked by nsw and the probability to update to X is marked by swX. Panel (a) Weight update probability for W=1(1). Panels (b)-(c): The different zero states have different switching probabilities, which is the drawback of the suggested MTJ-based synapse. 0s is sensitive to the v value, and $0_w$ to k values.

The control signals are given by $$\begin{cases} e_{1,p} = -e_{2,p} = -\text{sign}(\Delta W_{ij})V_{dd}, & \text{if } \kappa_{ij} \neq 0 \\ e_{1,p} = e_{2,p} = V_{dd}, & \text{else} \end{cases} \quad (13)$$

$$e_{1,n} = \begin{cases} -\text{sign}(\Delta W_{ij})V_{dd}, & 0 < t < |v_{ij}|T_{up} \\ -V_{dd}, & |v_{ij}|T_{up} < t < T_{up} \end{cases} \quad (14)$$

$$e_{2,n} = \begin{cases} \text{sign}(\Delta W_{ij})V_{dd}, & 0 < t < |v_{ij}|T_{up} \\ -V_{dd}, & |v_{ij}|T_{up} < t < T_{up} \end{cases} \quad (15)$$

Figure 7C:
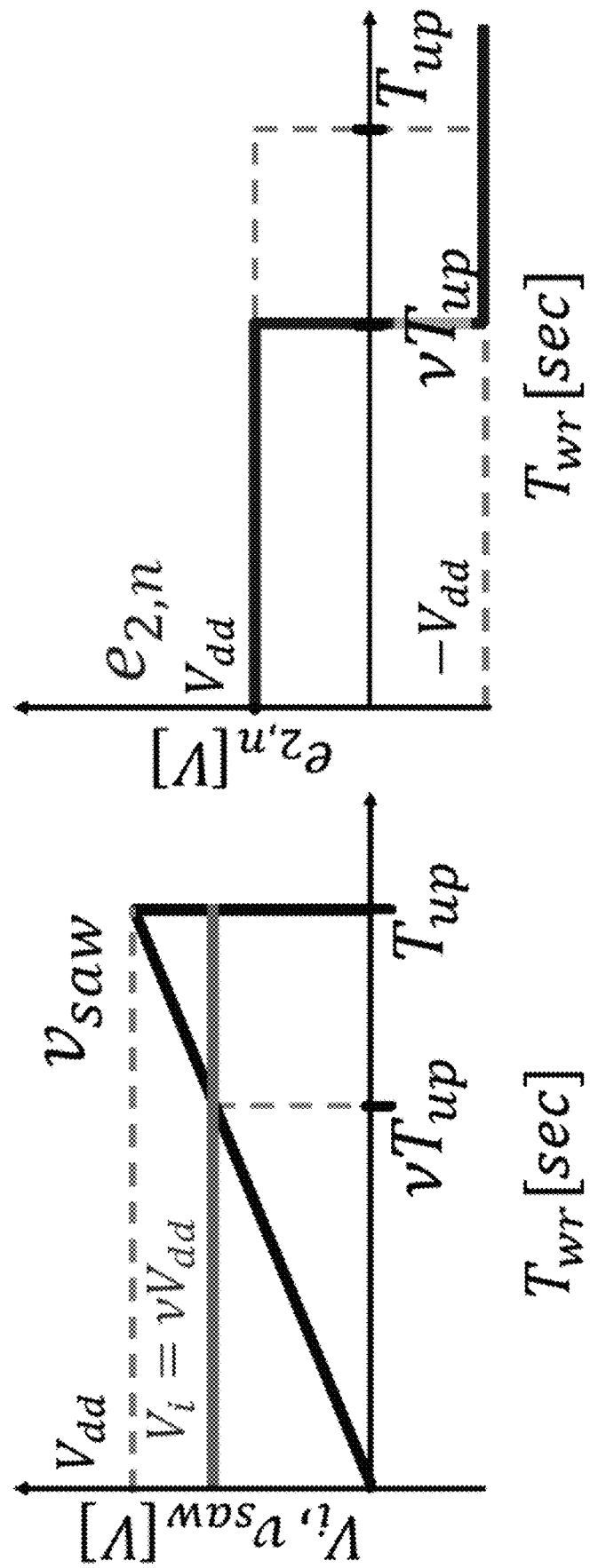
FIG. 7C illustrates the waveforms for a control signal, according to some embodiments of the present disclosure.

To obtain the required functionality of control signal $e_{in}$, voltage comparators may be used (FIG. 6A), the positive port of the comparator is fed with the voltage signal, $V_i = v_{ij}V_{dd}$, and the negative port, $V_n$, is connected to a sawtooth signal, $V_{n,1/2} = \mp T v_{saw}(t)$, which maintains $v_{saw}(T_{up}) = V_{dd}$. FIG. 7C illustrates the waveforms for $e_{2,n}$, which is equal to $V_{dd}$ until $v_{saw}(t)=V_{ij}V_{dd}$, meaning until $\Delta t = |v_{ij}|T_{up}$. The control signal $e_{2,n}$. $e_{2,n}=V_{dd}$ is generated as long as $V_{saw} < v_{ij}V_{dd}$, meaning that transistor $N_2$ will be open for $\Delta t = v_{ij}T_{up}$.

Support of Stochastic Gradient Descent

When the SGD algorithm is used to train the network, all the synapses in the array are updated in parallel. To support SGD training, minor changes need to be made to the proposed update scheme. Using SGD, the update is given by the gradient value, and is equal to $\Delta W = u^T y$, where y is the error propagated back to the layer, using the backpropagation algorithm, and u is the input. For TNN and BNN the input activations are $u \in \{-1,0,1\} = \{-V_{up}, 0, V_{up}\}$ and $u \in \{-1,1\} = \{-V_{up}, V_{up}\}$, respectively; thus, $\Delta W_{i,j} = y_i u_i = \text{sign}(u_j) y_i$ or $\Delta W_{i,j} = 0$ for $u = 0$. In this scheme, the voltage sources keep the activation values, so $u_1 = u_2 = u$ (whereas in the general scheme the voltage sources are set to $u_1 = u_2 = V_{up}$). The control signals are a function of the error y, whereas in ADAM and other optimization algorithms they are a function of the update value $\Delta W$. The control signal functionality for SGD is $$\begin{cases} e_{1,p} = -e_{2,p} = -\text{sign}(y_i) V_{dd}, & \text{if } \kappa_{ij} \neq 0 \\ e_{1,p} = e_{2,p} = V_{dd}, & \text{else} \end{cases} \quad (16)$$

$$e_{1,n} = \begin{cases} -\text{sign}(y_i) V_{dd}, & 0 < t < |v_{ij}| T_{up} \\ -V_{dd}, & |v_{ij}| T_{up} < t < T_{up} \end{cases} \quad (17)$$

$$e_{2,n} = \begin{cases} -\text{sign}(y_i) V_{dd}, & 0 < t < |v_{ij}| T_{up} \\ -V_{dd}, & |v_{ij}| T_{up} < t < T_{up} \end{cases} \quad (18)$$

The functionality of the control signals remains unchanged, the voltage source is selected according to y, and the voltage sign and the effective update duration are set as a function of $\kappa$ and $v$, the integer and remainder values of y, respectively. Therefore, the update equation is given by $$\Delta w_{ij} = \text{sign}(y_i)\text{sign}(u_j)(1_{\kappa \neq 0} + \text{Bern}(P_{sw}(v_{ij}))) \quad (19)$$

Figure 8:
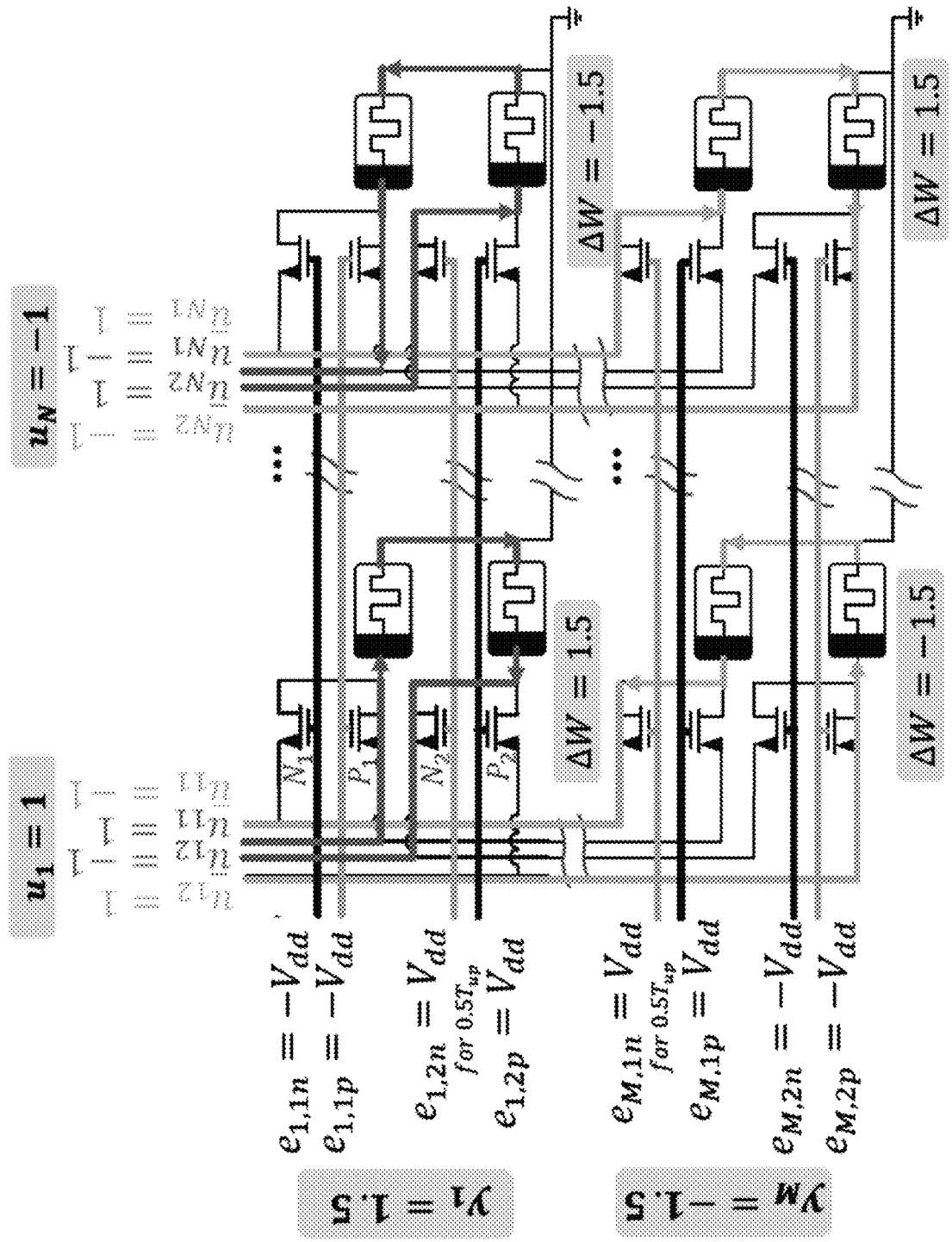
FIG. 8 shows a parallel SGD update, according to some embodiments of the present disclosure.

FIG. 8 shows a parallel SGD update. The column voltage is set to match the input activation, and the row controllers are functions of the error propagated back to the layer. The update is done in parallel to all synapses in the array.

Inverse Read

Figure 6B:
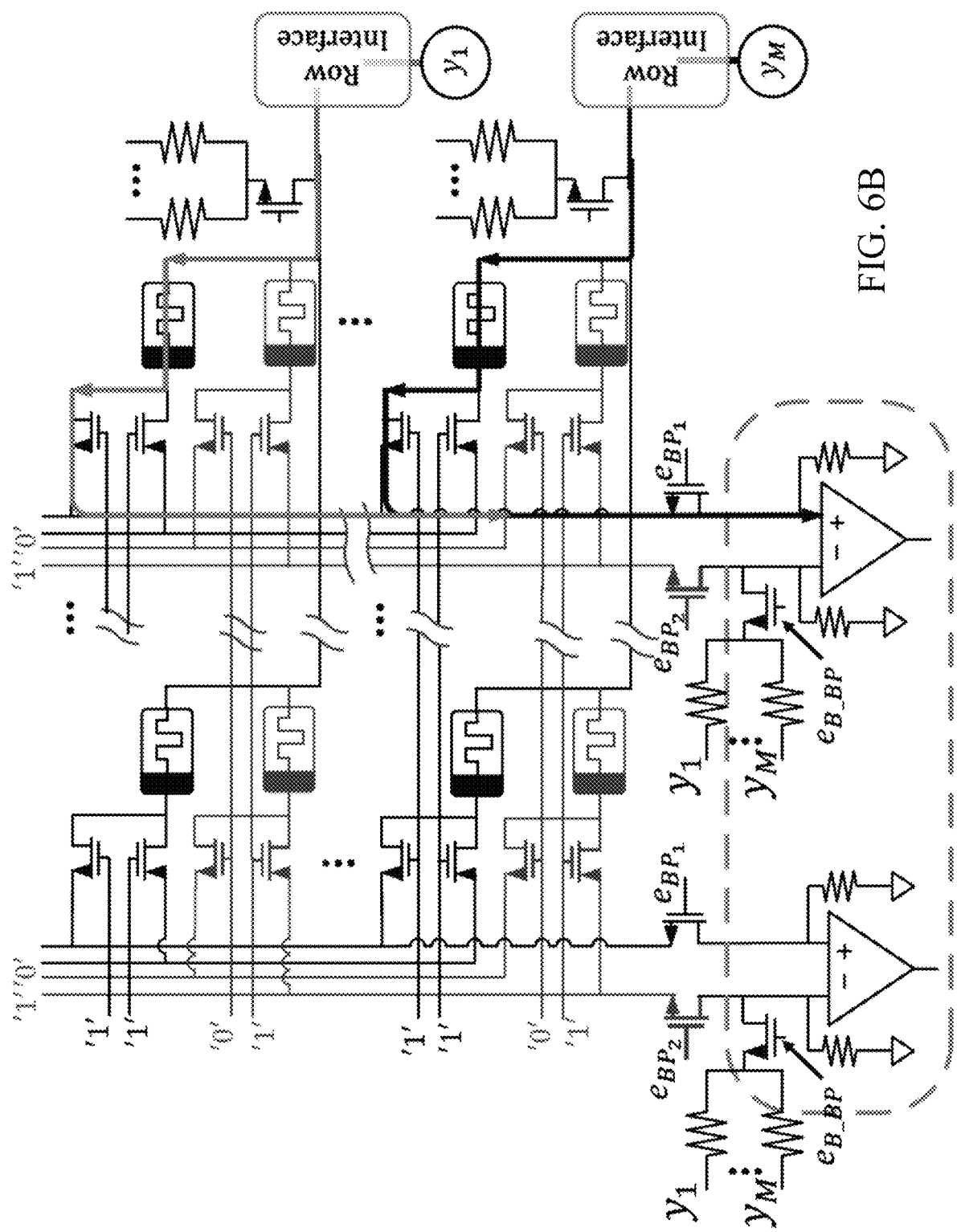

In some embodiments, to train the TNN, backpropagation of the error must be performed. Thus, an inverse matrix vector multiplication $W^T y$ is supported. Similarly to, the output row interface is used as an input. This allows reusing the same synapse array. Due to the synapse structure, the data is separated into two columns, as shown in FIG. 6B. The output current, $I_{i,R_1} - I_{i,R_2}$, is converted to voltage using a voltage comparator.

TERNARY SYNAPSE UPDATE EXAMPLES

To clarify the update scheme proposed by the present disclosure, two examples of synapse updates are given.

Example 1

Figure 9A:
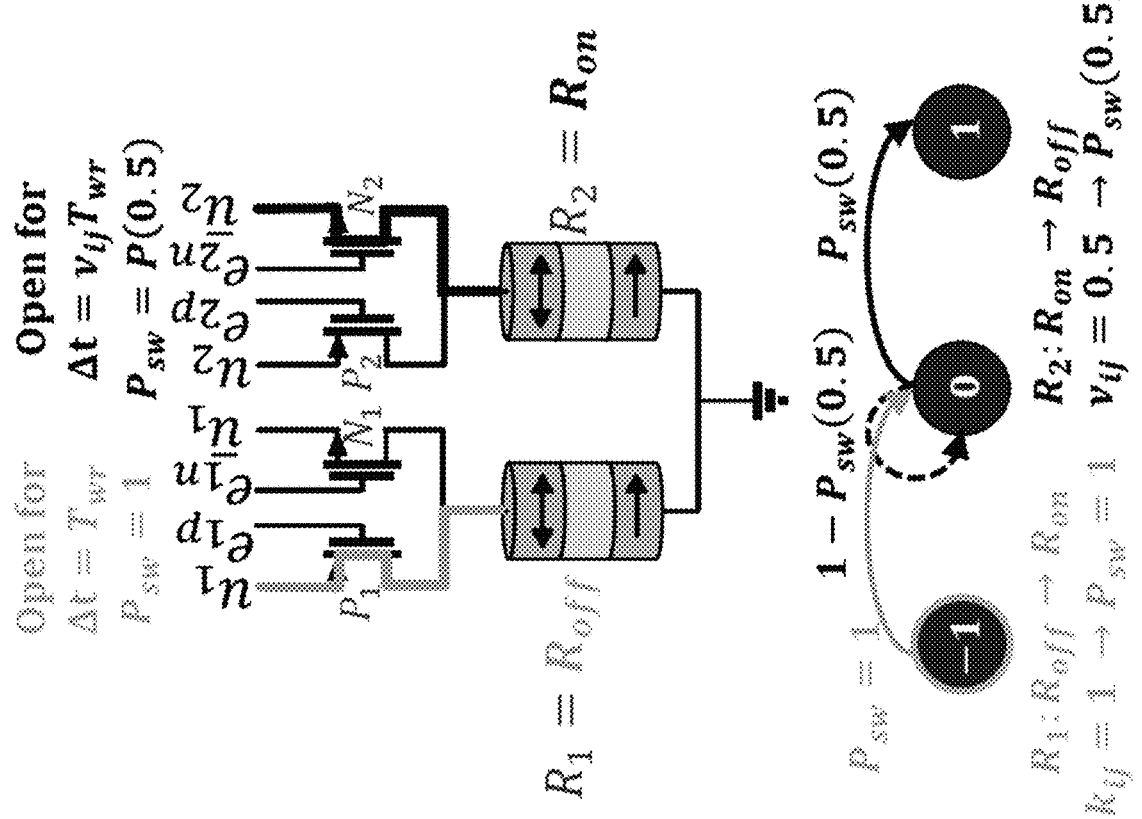
FIG. 9A shows a case where a synapse weight is 1, and the update value is 1.5, according to some embodiments of the present disclosure.

FIG. 9A shows the case where a synapse weight is $-1$, and the update value is 1.5. Thus, $k=1$ and $v=0.5$. In that case, $\lfloor \Delta W \rfloor \neq 0$ and $\text{sign}(\Delta W)=1$. Hence, $e_{1,p} = e_{2,p} = V_{dd}$; therefore, $P_1$ is ON and $P_2$ is OFF for time interval $T_{up}$. Hence, $P_{sw,1} \approx 1$. $e_{1,n} = -V_{dd}$ for $T_{up}$ and $e_{2,n}$ is ON for $0.5 T_{up}$, as given by $$e_{2,n} = \begin{cases} V_{dd} & 0 < t < 0.5 T_{up} \\ -V_{dd} & 0.5 T_{up} < t < T_{up} \end{cases} \quad (20)$$

Therefore, $R_2$ will switch with probability $$P_{sw,2} = P\left(\frac{0.5 T_{up} V_{up}}{R_{on}}\right).$$

In this example, the synapse weight will be updated from $-1 \to 0$ with probability $$P_{-1 \to 0} = P_{-1 \to 0_w} + P_{-1 \to 0_s} = \quad (21)$$
$$P_{sw,1}(1 - P_{sw,2}) + (1 - P_{sw,1})(1 - P_{sw,2}) \approx (1 - P_{sw,2}),$$

and might switch to 1 with probability $$P_{-1 \to 1} = P_{sw,1} P_{sw,2} \approx P_{sw,2}. \quad (22)$$

Note that when $W=-1$, $\{R_1, R_2\} = \{R_{off}, R_{on}\}$. Thus, if $\Delta W < 0$, the current flow direction will be from $R_2$ to $R_1$ and the MTJ cannot switch.

Example 2

Figure 9B:
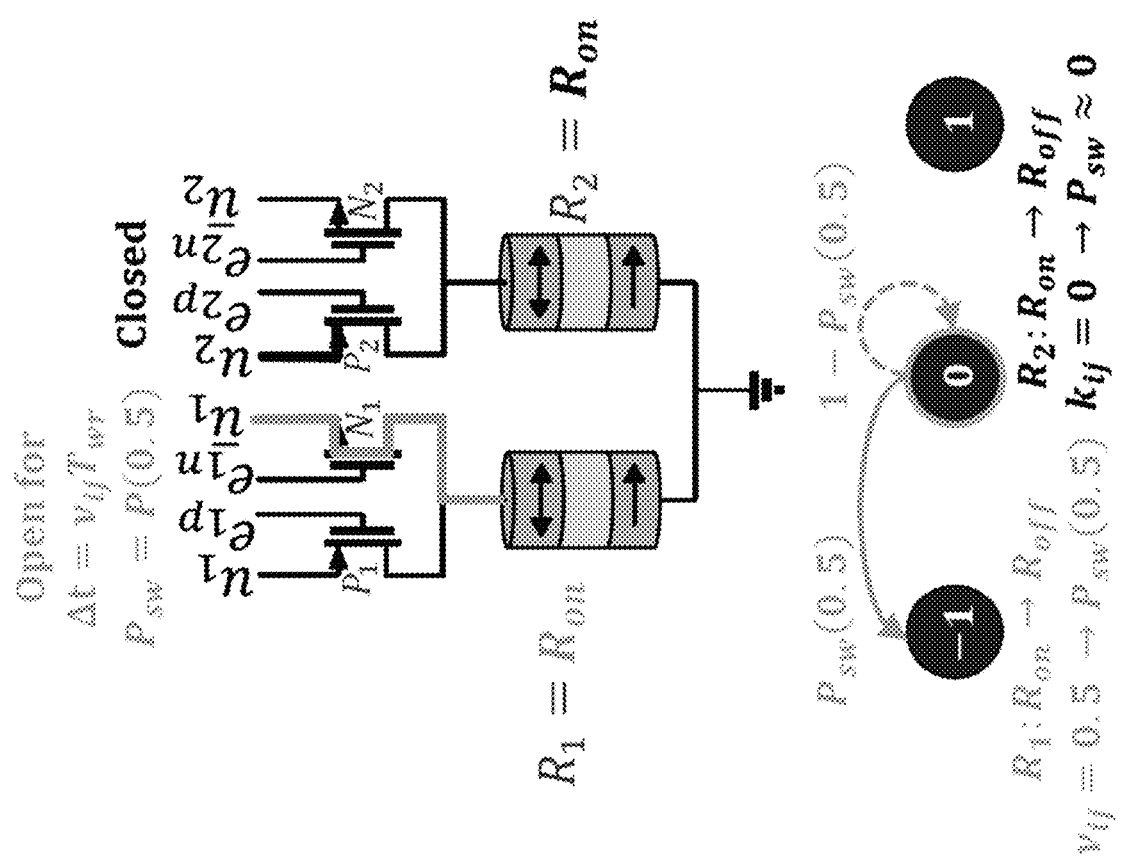
FIG. 9B shows the case where a synapse weight is $0_w$, and the update value is −0.5, according to some embodiments of the present disclosure.

FIG. 9B shows the case where a synapse weight is $0_w$, and the update value is $-0.5$. Thus, $k=0$ and $v=-0.5$. Hence, $\lfloor \Delta W \rfloor \neq 0$ and $\text{sign}(\Delta W)=-1$. Consequently, $e_{1,p} = e_{2,p} = V_{dd}$, so both $P_1$ and $P_2$ are closed for $T_{up}$. $e_{2,n} = V_{dd}$ for $T_{up}$ and $e_{1,n}$ is open for $0.5 T_{up}$, as given by $$e_{1,n} = \begin{cases} V_{dd} & 0 < f < 0.5 T_{up} \\ -V_{dd} & 0.5 T_{up} < t < T_{up} \end{cases} \quad (23)$$

Therefore, $R_1$ will switch with probability $$P_{sw,1} = P\left(\frac{0.5 T_{up} V_{up}}{R_{on}}\right).$$

In this example, the synapse weight is updated from $0_w \to -1$ with probability $P = P_{sw,1}$. Although theoretically no current should flow through $R_2$, with probability $P_{sw,2} \approx 0$ it might switch from $R_{on}$ to $R_{off}$ due to leakage currents. It is important to note that the switching probability is a function of the resistance; therefore, the switching probability of $0_s = \{R_{off}, R_{off}\}$ is lower than $0_w = \{R_{on}, R_{on}\}$.

Support for Binary Neural Networks

MTJ-Based Binary Synapses

To support BNN instead of TNN, the GXNOR operation is replaced by a simple XNOR operation and the quantized space resolution is $\Delta z_0 = 2$.

Proposed Synapse Circuit and Synapse Array

Figure 10A:
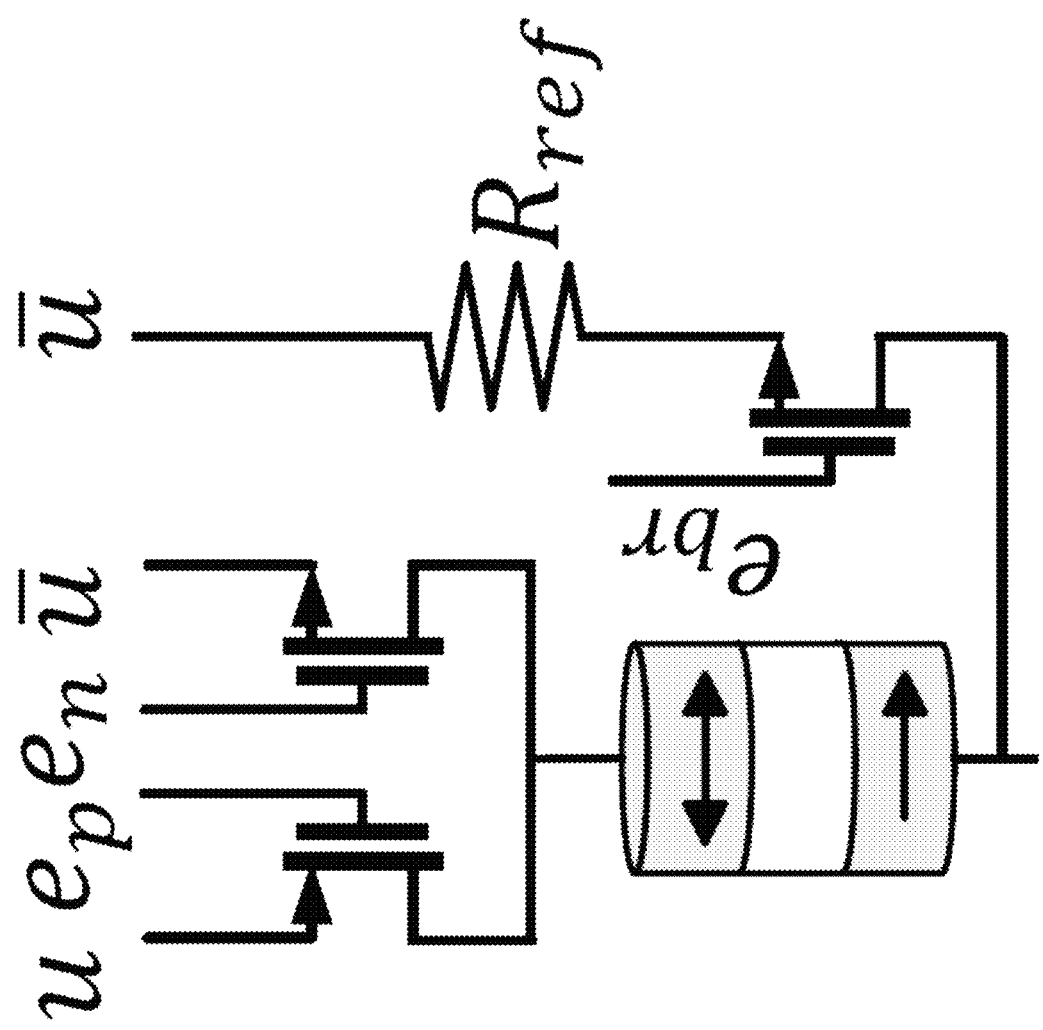
FIG. 10A shows a binary synapse, wherein a reference resistor is added for each synapse, according to some embodiments of the present disclosure.
Figure 10B:
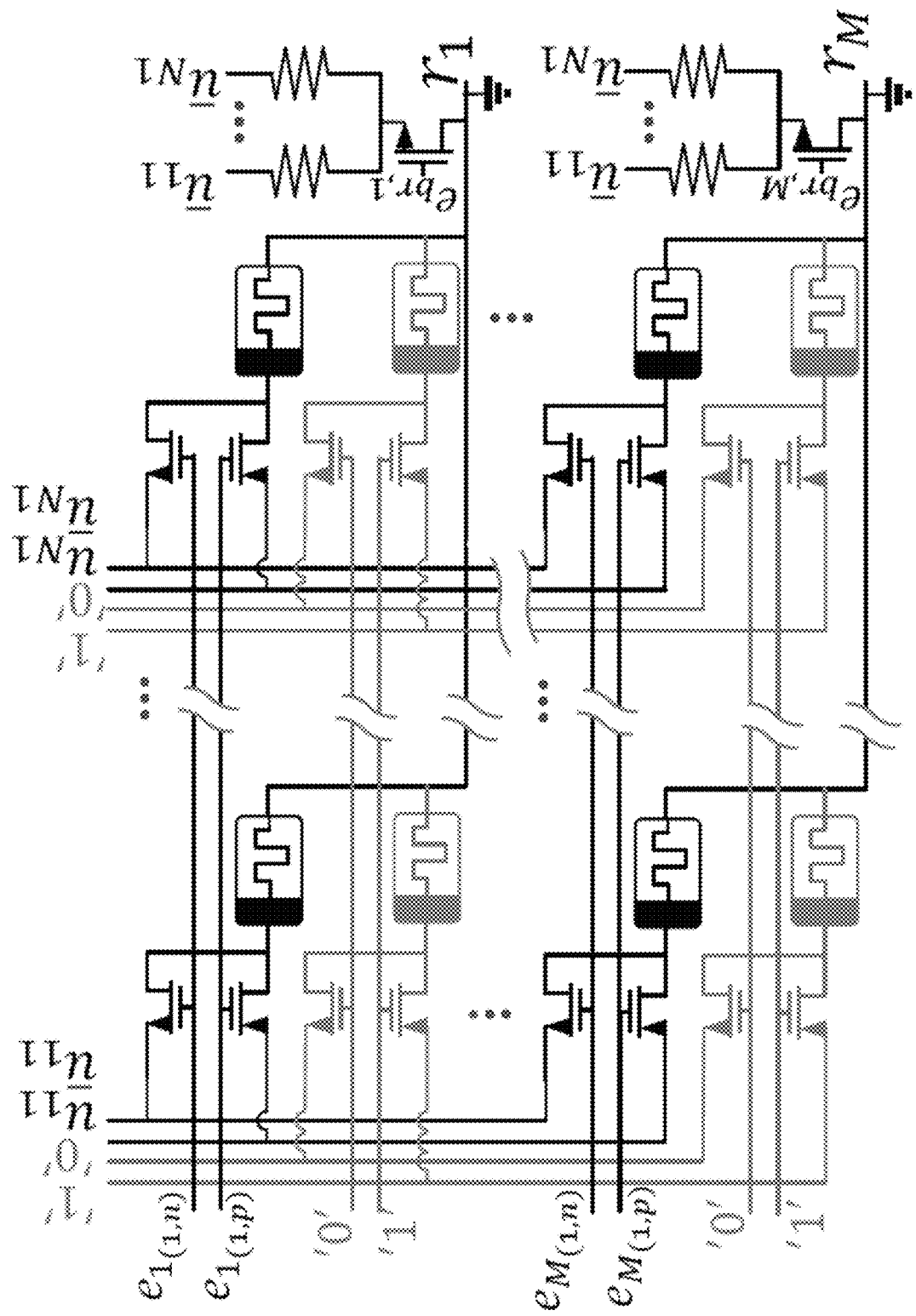
FIG. 10B shows a binary synapse array, according to some embodiments of the present disclosure.
Figure 10C:
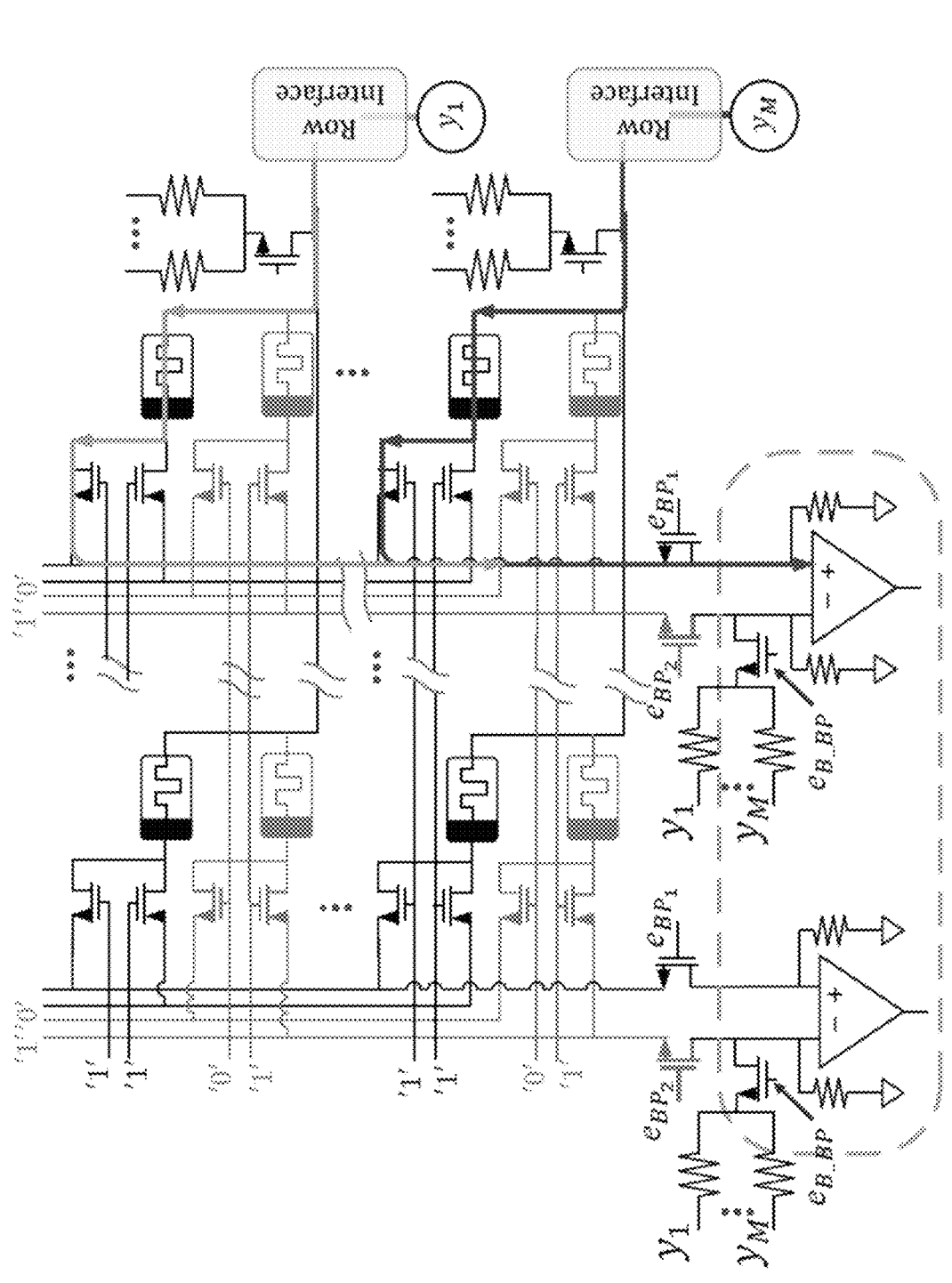
FIG. 10C shows the data flow of the inverse read operation, according to some embodiments of the present disclosure.

FIG. 10A shows a binary synapse, wherein a reference resistor is added for each synapse. FIG. 10B shows a binary synapse array. To support binary weights with the ternary synapse, only one "branch" of the synapse is used; the deactivated branch is marked in grey. FIG. 10C shows the data flow of the inverse read operation.

Synapse Circuit

To support BWS, a 2T1R synapse is used as illustrated in FIG. 10A. To reuse the ternary synapse proposed herein to support binary weights, one "branch" of the synapse array is deactivated. To represent ±1 values, a reference resistor $$R_{ref} = \left(\frac{G_{on} + G_{off}}{2}\right)^{-1}$$

is added per synapse, and is connected in parallel to $\bar{u}$ of the corresponding synapse.

In some embodiments, the ternary synapse may be separated into two binary synapses with $e_{1,n}=e_{2,n}$ and $e_{1,p}=e_{2,p}$. Unfortunately, due to the use of the comparator, the ternary array cannot support the inverse read from all the columns; thus, it cannot support the backpropagation when the ternary synapse is split to two binary synapses. The 2T1R synapse can be used to design a dedicated engine for BNN; such a design does not need the comparators.

Synapse Weight

Table 2 below defines the values of the weights when a 2T1R synapse is used. MTJ resistance of $R_{on}$ leads to W=1 and resistance of $R_{off}$ leads to W=−1. To compute the XNOR operation between the weights and activation, u, the synapse current is compared to the reference value $$I_{ref} = -uG_{ref} = -u\frac{G_{on} + G_{off}}{2}.$$

The result of the XNOR operation is given in the right column of Table 2 below. While other methods to support binary weights can be considered (for example, using the resistance threshold value to separate the ±1 weight values), this solution was chosen due to the low ratio between $R_{off}$ and $R_{on}$, which is a common property of MTJ devices.

Synapse Array

If the proposed synapse array is used, each weight can use only one branch of the ternary synapse; thus the synapse can represent only a single bit, and half of the array is deactivated using binary mode. The reference resistors added to each row are located together (see FIG. 10B) and are active only during the feedforward phase of the BNN ($e_{br}$='1').

Training BNN XNOR and Feedforward

As in the GXNOR operation, the input neuron values may be denoted as the voltage sources. The logic values {−1,1} are represented by $u \in \{-V_{rd}, V_{rd}\}$. The result of each XNOR operation is $$I_{out}=Gu, \quad (24)$$

where G is the conductance of the MTJ. During feedforward, the control signal $e_{br}$='1', and hence the reference resistors are connected and the current through each row is $$I_{row,i} = \sum_{j=1}^{M} G_{ij}u_j + \sum_{j=1}^{M} G_{ij}\bar{u}_j = \frac{R_{off} - R_{on}}{2R_{off}R_{on}}(M_{+1,i} - M_{-1,i})V_{rd}, \quad (25)$$

where $G_{ij}$ is the MTJ conductivity of synapse j in row i, M is the number of synapses per row, $M_{+1,i}$ is the total number of positive products in row i, and $M_{-1,i}$ is the total number of negative products in row i.

Training BNN—Weight Update

In a manner similar to the TNN update scheme disclosed herein, the MTJ device of each binary synapse is updated to support the GXNOR algorithm. FIG. 4 illustrates two update examples for the binary weights using the GXNOR algorithm. The control signal must have the following functionality: if $\kappa_{ij}=*\Delta W_{ij}/2 \neq 0$, a switch will occur with probability $P_{sw} \approx 1$; otherwise the switching probability is a function of $v_{ij}$=reminder($\Delta W_{ij}/2$).

The control signals are set as follows. First, the reference resistors are disconnected, and thus $$e_{br}='0'. \quad (26)$$

The row control signals are $$\begin{cases} e_{2,n} = -V_{dd}, \\ e_{2,p} = V_{dd} \end{cases}, \quad (27)$$

so branch 2 of each synapse is deactivated. Signals $e_{1,p}$ and $e_{1,n}$, which control the weight update, are given by $$e_{1,p} = \begin{cases} -\text{sign}(\Delta W_{ij})V_{dd}, & 0 < t < \psi T_{up} \\ V_{dd}, & \psi T_{up} < t < T_{up} \end{cases} \quad (28)$$

$$e_{1,n} = \begin{cases} -\text{sign}(\Delta W_{ij})V_{dd}, & 0 < t < T_{up} \\ -V_{dd}, & \psi T_{up} < t < T_{up} \end{cases} \quad (29)$$

where $\omega=\max(|\kappa_{ij}|,|v_{ij}|)$.

Training BNN—Inverse Read

To compute the value of each multiplication, the current read from the activated synapse must be compared to the reference value $$I_{ref} = -yG_{ref} = -y\frac{G_{on} + G_{off}}{2}.$$

As in the feedforward solution, a reference resistor is added per synapse in the column, and voltage y is applied across it. The resistors are located together as illustrated in FIG. 7C and are connected to the row only if $e_{B_{BP}}$='1'. Thus, the current comparator will compute $$\sum_{i=1}^{N}(I_{i,R_1} - I_{i,ref}) = \sum_{i=1}^{N}\left(G_{ij} - \frac{G_{on} + G_{off}}{2}\right)y_i, \quad (30)$$

where N is the number of synapses per column.

TABLE 2

Binary Synapse States and Output Current

| Weight | R | $I_{out}$ | $I_{out} - uG_{ref}$ |
|---|---|---|---|
| 1 | $R_{on}$ | $G_{on}u$ | $u\dfrac{R_{off} - R_{on}}{2R_{off}R_{on}}$ |
| −1 | $R_{off}$ | $G_{off}u$ | $-u\dfrac{R_{off} - R_{on}}{2R_{off}R_{on}}$ |

Evaluation and Design Considerations

The present inventors have conducted an evaluation of the synapse circuit and array, and the circuit parameters and behavior were extracted and used for the training simulations. Herein, the software and the MTJ-based implementations of the GXNOR algorithm are referred to as GXNOR and MTJ-GXNOR, respectively.

Circuit Evaluation

The synapse circuit was designed and evaluated in Cadence Virtuoso for the GlobalFoundries 28 nm FD-SOI process. The MTJ device parameters are listed in Table 3 below. The read voltage, $V_{rd}$, was set to guarantee a low-current regime and negligible switching probability for the feedforward and inverse read operations. Likewise, the update voltage, $v_{up}$, was set to guarantee a high-current regime. The update time period was set to match $P_{sw}(T_{up}) \approx 1$.

MTJ Switching Simulation

To evaluate the MTJ transition resistance and the impact of the MTJ transient response on the synapse circuit operation, the present inventors ran a Monte-Carlo simulation of the MTJ operation. The simulation numerically solves the LandauLifshitz Gilbert (LLG) differential equation (assuming the MTJ is a single magnetic domain) with the addition of a stochastic term for the thermal fluctuations and Slonczewski's STT term. For each iteration of the Monte-Carlo simulation, a different random sequence was introduced to the LLG equation and the resulting MTJ resistance trace was retrieved. The equation was solved using a standard midpoint scheme and was interpreted in the sense of Stratonovich, assuming no external magnetic field and a voltage pulse waveform. The resistance of the MTJ was taken as $$R_{on}\frac{1+P^2}{1+P^2\cos\theta},$$

where θ is the angle between magnetization moments of the free and fixed layers and P is the spin polarization of the current. To approximate the time-variation resistance of an MTJ during the switch between states, all the traces from the Monte-Carlo simulation were aligned using the first time that the resistance of the MTJ reached $$\frac{R_{on}+R_{off}}{2}.$$

After the alignment, a mean trace was extracted and used for the fit. This fit was used as the time-variation resistance when the MTJ made a state switch.

Circuit Schematic Model

Figure 11:
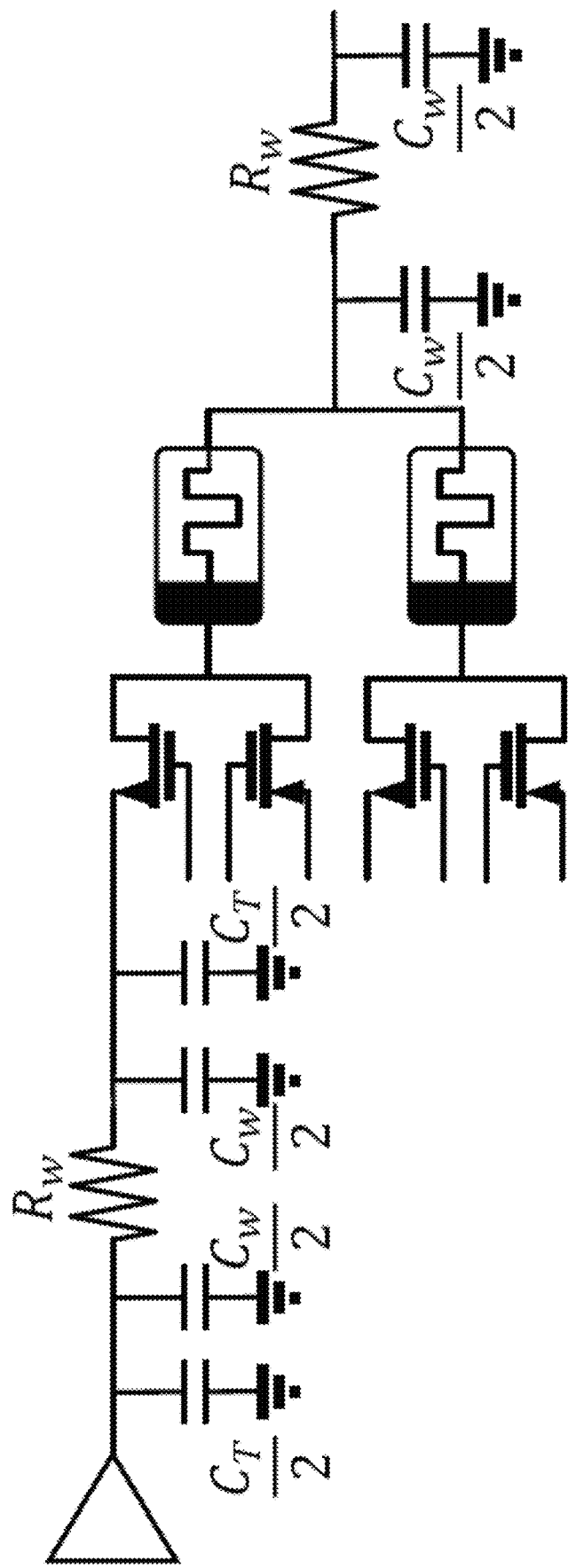
FIG. 11 shows a circuit schematic model which considers the parasitic capacitance and resistance of the wires and transistors, according to some embodiments of the present disclosure.

FIG. 11 shows a circuit schematic model which considers the parasitic capacitance and resistance of the wires and transistors, which are dependent on the cell location within the synapse array. The transistor and the interconnect affect the circuit performance and operations. Therefore, the circuit model illustrated in FIG. 11 is adopted, which considers the parasitic resistance and capacitance. The corner cases were considered (i.e., the synapses located at the four corners of the synapse array) to evaluate the effect of the wires and transistors on operation results, latency and power consumption. For the following circuit simulations, the worst case was considered where the wire resistance and capacitance are the most significant (i.e., for an array of size M×N, the synapse located at [M,1]).

TABLE 3

| Circuit Parameters | | | |
|---|---|---|---|
| Parameter | Value | Parameter | Value |
| MTJ | | | |
| a[nm] | 50 | Temp. [K] | 300 |
| b[nm] | 20 | $R_{on}[\Omega]$ | 1500 |
| $t_f$[nm] | 2.0 | $R_{off}[\Omega]$ | 2500 |
| $\mu_0 M_s$[T][1] | 0.5 | α | 0.01 |
| CMOS | | | |
| $V_{DD}$[V] | 1 | $W/L_{PMOS}$ | 33 |
| $V_{SS}$[V] | −1 | $W/L_{NMOS}$ | 20 |
| $K_{up}$[V] | 1 | $T_{up}$[ns] | 2 |
| $K_{rd}$[V] | 0.1 | $T_{rd}$[ns] | 0.5 |

[1]To achieve higher switching probability, the value of $\mu_0 M_s$ was changed Circuit Operations

GXNOR

Figure 12:
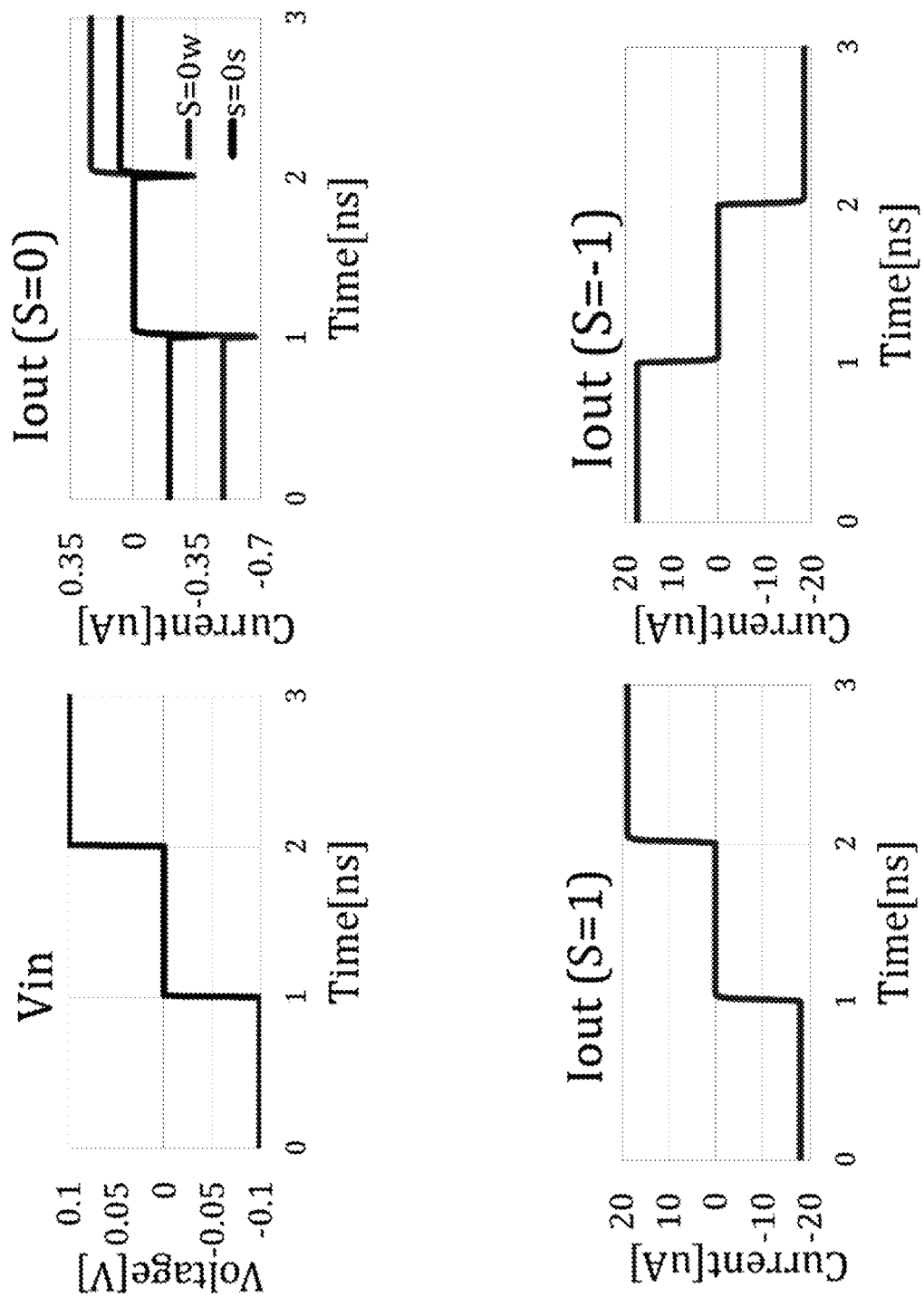
FIG. 12 shows the result of the GXNOR operation between the input voltage $V_n \in \{-1,0,1\} = \{-V_{rd}, 0, V_{rd}\}$ and the weight value, according to some embodiments of the present disclosure.

FIG. 12 shows the result of the GXNOR operation between the input voltage $V_{in} \in \{-1,0,1\} = \{-V_{rd}, 0, V_{rd}\}$ and the weight value (S in FIG. 12). During the GXNOR operation, (read operation) $V_{rd}$ is 0.1V to guarantee low current domain and low switching probability. For $V_{ij} \neq 0$ and $S=0_{w/s}$, the output current is not zero. This is a source for error when the GXNOR results are summed to compute the activation value. Limiting the dimensions of the synapse array can mitigate this effect.

The GXNOR operation for a single synapse is shown in FIG. 12. When the activation (input) or the weight (S) is zero, the output current is one order of magnitude lower than in the other cases. Due to the different resistance of the PMOS and NMOS transistors, the input voltage is set to achieve similar current values when S #0 and $V_{in} \neq 0$.

The GXNOR result for a 128×128 synapse array and four active synapses in a single row were also simulated, for simplicity. The synapses were located at row 128, and columns [0,32,96,128], to maximize the effect of wire parasitic resistance and capacitance on the results. The simulation results are listed in Table 4 below, which shows GXNOR and accumulate for four synapses. The activation value of the input (a), weight value of the ternary synapse (w), and the current per synapse ($I_{syn}$) are listed. ti w is the expected output, $I_{out}$ is the current measured at the output of each row.

TABLE 4

| GXNOR and accumulate for four synapses | | | | | | | | | | | | |
|---|---|---|---|---|---|---|---|---|---|---|---|---|
| Synapse | a | w | $I_{syn}$ | a | w | $I_{syn}$ | a | w | $I_{syn}$ | a | w | $I_{syn}$ |
| Syn, 1 | 0 | −1 | −1.65 nA | 1 | 1 | 1.22 μA | −1 | −1 | 1.16 μA | −1 | −1 | 1.11 μA |
| Syn, 2 | 1 | $0_w$ | 12.2 nA | 1 | −1 | −1.27 μA | −1 | $0_w$ | −7.32 uA | −1 | −1 | 1.18 μA |
| Syn, 3 | −1 | −1 | 1.28 μA | 1 | −1 | −1.27 μA | 1 | $0_s$ | 9.3 nA | 1 | −1 | −1.27 μA |

TABLE 4-continued

GXNOR and accumulate for four synapses

| Synapse | a | w | $I_{syn}$ | a | w | $I_{syn}$ | a | w | $I_{syn}$ | a | w | $I_{syn}$ |
|---|---|---|---|---|---|---|---|---|---|---|---|---|
| Syn, 4 | 1 | $0_s$ | 9.72 nA | 1 | −1 | −1.27 µA | 1 | $0_w$ | 1.34 nA | 1 | −1 | −1.27 µA |
| $\bar{a} \cdot \bar{w}$ | | 1 | | | −2 | | | 1 | | | 0 | |
| $I_{out}$ | | | 1.3 µA | | | −2.59 µA | | | 1.11 µA | | | −0.256 µA |

Inverse Read

Figure 13A:
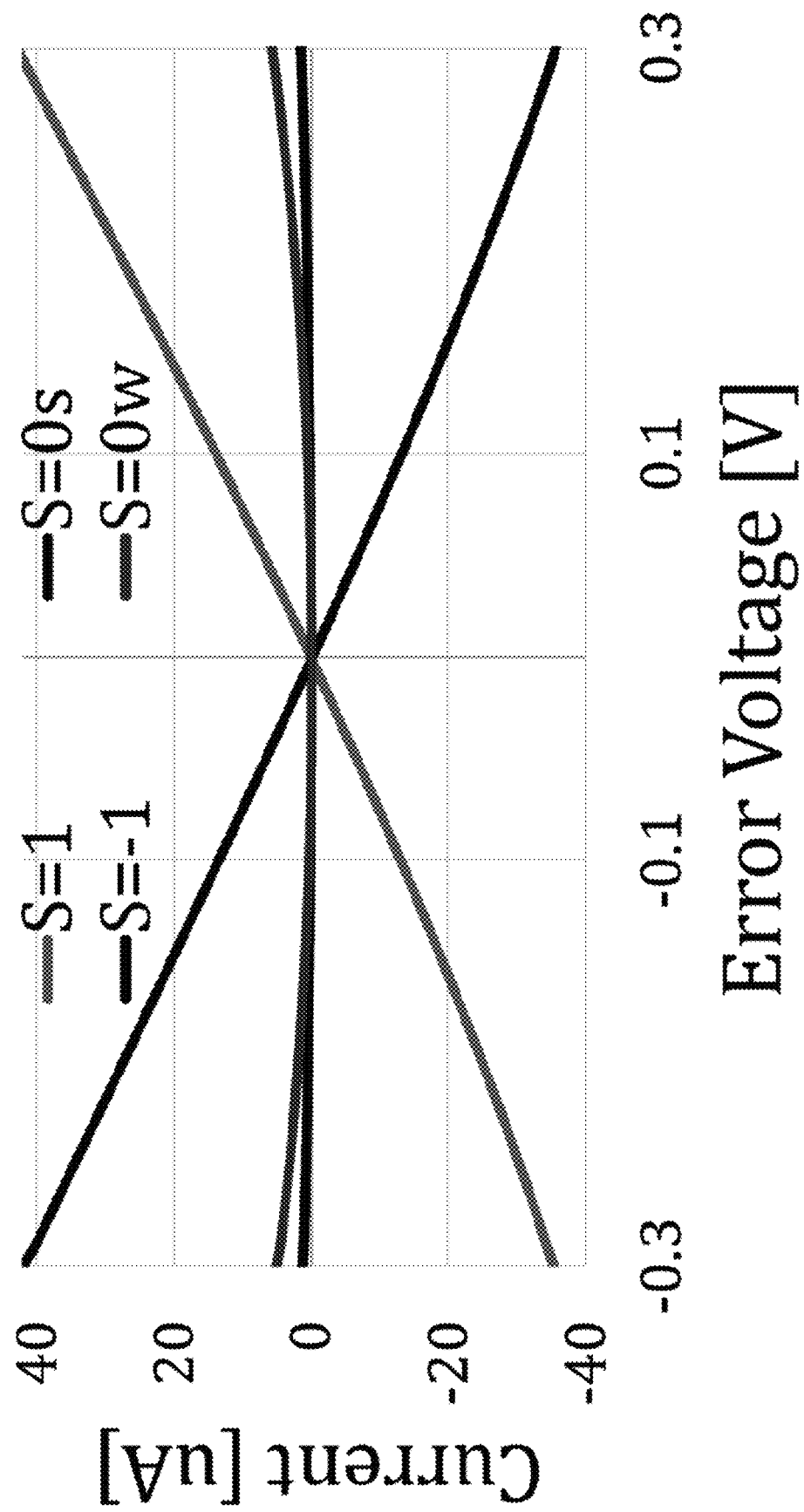
FIG. 13A shows the current difference between the positive and negative column, according to some embodiments of the present disclosure.
Figure 13B:
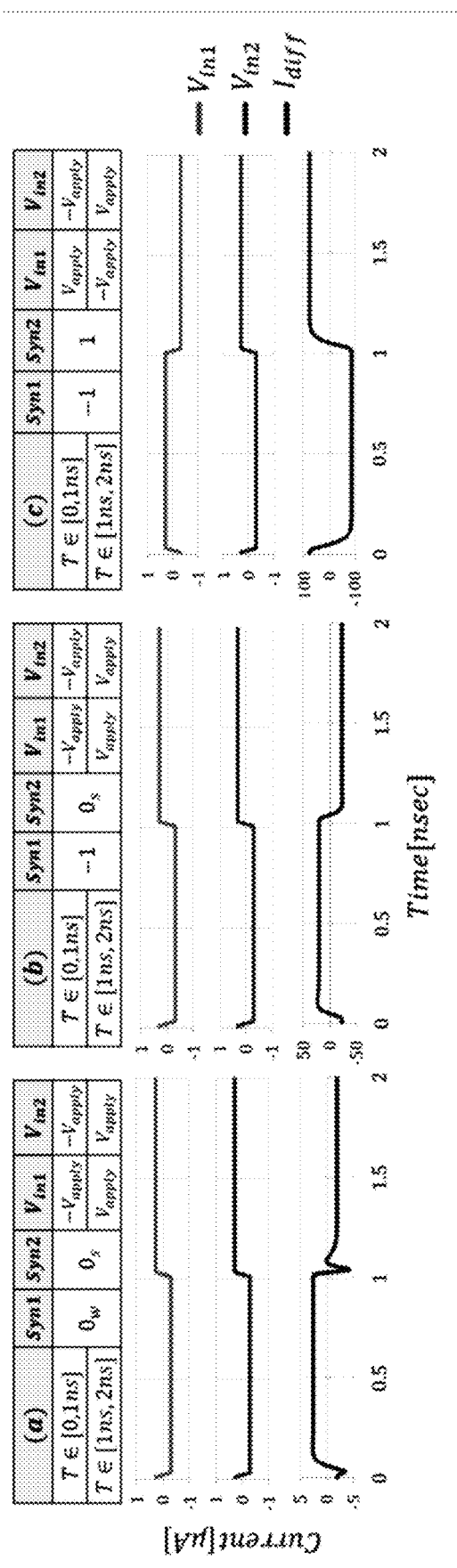
FIG. 13B shows a simple example of the inverse read operation for two synapses per column, according to some embodiments of the present disclosure.

FIGS. 13A-13B shows the inverse read operation. The error is propagated back through the synapse array; the error value is a real number which, unlike the inputs and the weights, is not bounded to the discrete space. The input voltage represents the error back-propagated through the synapse array. FIG. 13A shows the current difference between the positive and negative column. FIG. 13B shows a simple example of the inverse read operation for two synapses per column, for input voltage $V_{apply}=\pm0.3V$. The value of the error is a real number and the present simulations show that the error value is usually small. Therefore, the input voltage has to support high resolution. Supporting such resolution requires a high resolution, power hungry DAC. To overcome this limitation, the bit-streaming computation is adopted, so only a 1-bit DAC is needed.

MTJ-GXNOR Training Simulation

To evaluate the training performance of the MTJ-based synapse, the present inventors simulated the training of two TNN and BNN architectures using the MTJ-based synapse over the MNIST and SVHN datasets in PyTorch (see, Y. Lecun, L. Bottou, Y. Bengio, and P. Haffner, "Gradient-based learning applied to document recognition," Proceedings of the IEEE, vol. 86, pp. 2278-2324, November 1998; Y. Netzer, T. Wang, A. Coates, A. Bissacco, B. Wu, and A. Y. Ng, "Reading digits in natural images with unsupervised feature learning," in NIPS Workshop on Deep Learning and Unsupervised Feature Learning 2011). The network architecture for MNIST is "32C5-MP2-64C5-MP2-512FC-SVM," and for SVHN it is "2×(128C3)-MP2-2×(256C3)-MP2-2×(512C3)-MP2-1024FC-SVM." The synapse circuit parameters were extracted from the SPICE simulations. Table 5 lists the test accuracy of MTJ-GXNOR as compared to GXNOR and other state-of-the-art algorithms. BNNs and BWNs constrain the weights and activation to the ternary and binary spaces. However, in contrast to GXNOR, these networks keep the full-precision weights during the training phase, which increases the frequency of memory access and requires supporting full-precision arithmetic. The results of the TNN training using the MTJ-based synapse (MTJ-GXNOR TNN) are similar to the results of the GXNOR training. When the ternary synapse is used, the activation can be constrained to binary values using a sign function, although the weights cannot be constrained to the binary space. Therefore, a mixed precision network that uses binary activations with ternary weights (MTJ-GXNOR Bin-Activation) is also explored. When trained on the SVHN dataset, the test accuracy of MTJ-GXNOR BNN is lower than that of GXNOR BNN, while the test accuracy of MTJ-GXNOR Bin-Activation is closer to that of GXNOR TNN.

TABLE 5

Accuracy of State-of-The-Art Algorithms

| | Datasets | |
|---|---|---|
| 2*Methods | MNIST | SVHN |
| BNNs | 98.6% | 97.20% |
| BWNs | 98.82% | 97.70% |
| GXNOR TNN | 99.32% | 94.12% |
| GXNOR BNN | 98.54% | 91.68% |
| MTJ-GXNOR TNN | 98.61% | 93.99% |
| MTJ-GXNOR Bin-Activation | 98.6% | 93.62% |
| MTJ-GXNOR BNN Full | 97.84% | 89.46% |

Sensitivity to Process Variation

Variation in the device parameters and environment may affect the performance of the proposed circuits. Herein, the sensitivity of the TNN training performance to process variation is evaluated.

Resistance Variation and θ Distribution Variation

Two cases of process variation were considered: resistance variation; and variation in θ distribution. Variation in the device resistance and θ distribution may lead to different switching probability per MTJ device. To evaluate the sensitivity of the training to the device-to-device variation, the MNIST-architecture training was simulated with variations in the resistance and θ distributions. Several Gaussian variabilities were examined with different relative standard deviations (RSD). Table 6 lists the training accuracy for resistance variation and θ variation. The resistance RSD was found to be approximately 5%, while the present simulations show that the training accuracy is robust to the resistance variation even for higher RSD values (e.g. only 0.46% accuracy degradation for RSD=30%). The training accuracy is more sensitive to variations in θ. Nevertheless, high standard deviation of θ values results in better training accuracy. The performance of the MTJ-GXNOR algorithm improves for higher variations in θ. Table 7 lists the training results for different $θ_0$ values; the $θ_0$ value used in this work is marked in bold. Larger $θ_0$ values, which correspond to higher randomness of the MTJ switching process, yield better accuracy.

TABLE 6

Test Accuracy vs. Process Variation for MNIST

| RSD | Resistance Variation | $θ_0$ Variation |
|---|---|---|
| 0% | 98.61% | 98.61% |
| 1% | 98.13% | 97.98% |
| 5% | 98.13% | 97.92% |
| 10% | 98.1% | 97.98% |
| 30% | 98.15% | 98.05% |
| 35% | 97.94% | 98.05% |

TABLE 7

Test Accuracy vs. $\theta_0$

| $\theta_0$ [rad] | Test Accu. |
|---|---|
| 0.0913 | 94.28% |
| 0.1141 | 94.98% |
| 0.2739 | 97.39% |
| 0.345 | 98.61% |

Sensitivity to Voltage Non-Ideality

Figure 14:
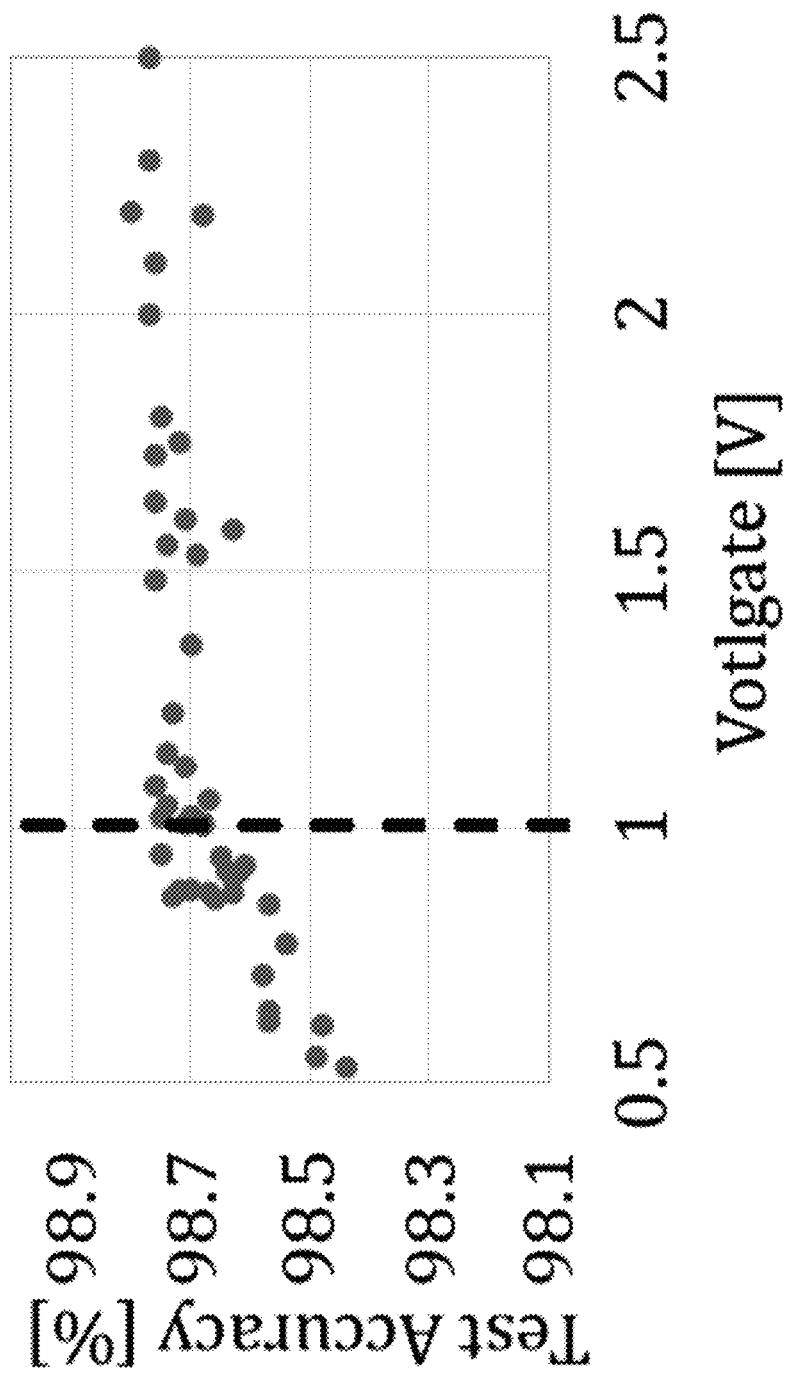
FIG. 14 shows the increase in the test accuracy for higher voltage magnitude, according to some embodiments of the present disclosure.

The operation most sensitive to voltage variation is the weight update operation, where the update probability is a function of the voltage drop across the MTJ device. Therefore, evaluate the test accuracy obtained for variation in the voltage source is evaluated. FIG. 14 shows the increase in the test accuracy for higher voltage magnitude, when low magnitude may lead to low-current regime and negligible switching probability.

Test accuracy for different voltage source values. Lower voltage magnitude decreases the switching probability, thus lowering the network accuracy. The dashed vertical line marks V=1[V], which is the value selected for $V_{up}$ in the present disclosure. Test accuracy for different voltage source values. Lower voltage magnitude decreases the switching probability, thus lowering the network accuracy. The dashed vertical line marks V=1 [V], which is the value selected for $V_{up}$ herein. Increasing the voltage leads to higher switching probability and $\theta_0$ variance. Hence, increasing the voltage magnitude increases the randomness of the MTJ switching. Therefore, the voltage magnitude can be used to improve the stochastic switching process and to improve the network training performance when using an MTJ device with low $\theta_0$ variance. In the case simulated in this work, increasing the voltage magnitude above $V_{up}$=1.1V only slightly improves test accuracy; hence, herein, $V_{up}$=1V to constrain the power consumption of the present design.

Sensitivity to Temperature.

The ambient temperature affects the switching behavior of the MTJ. When the temperature increases, the $R_{off}$ resistance decreases. The $R_{on}$ resistance value has a much weaker temperature dependency and it is nearly constant. The transistors can be described as variable current sources, where for high temperatures the drivability of the MOS transistor is degraded because the electron mobility decreases. Hence, the ambient temperature has opposite effects on the $R_{off}$ of the MTJ and the drivability of the MOS transistor, which affect the switching probability. Additionally, the initial magnetization angle, $\theta$, depends on the temperature by the normal distribution $\theta \neq \mathcal{N}(0,\theta_0)$, where the standard deviation is $\theta_0 = \sqrt{k_B T/(\mu_0 H_k M_s V)}$. Hence, $\theta_0$ increases for higher temperature.

Figure 15:
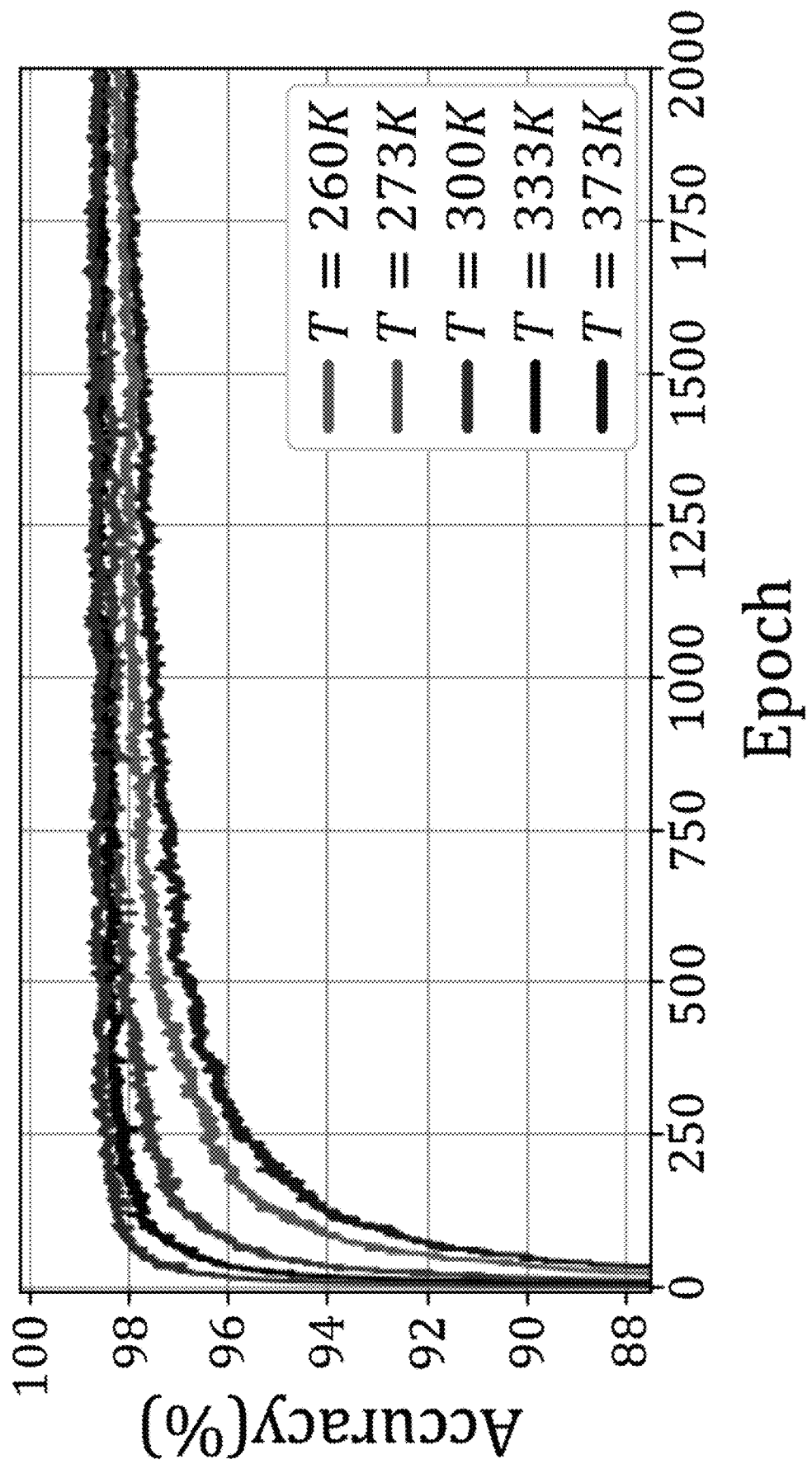
FIG. 15 shows the test accuracy over the training phase for the MNIST network, according to some embodiments of the present disclosure.

As mentioned above, the training performance is highly dependent on the variance of $\theta$. To estimate the sensitivity of the MTJ-based synapse to the temperature, MTJ-based training with different temperatures in the range [260K, 373K] was simulated, where the resistances are extrapolated to emulate the temperature dependence. Table 8 below lists the test accuracy obtained for different temperatures. Although better accuracy is obtained for higher temperatures, the training phase and network accuracy are robust to temperature variations. FIG. 15 shows the test accuracy over the training phase for the MNIST network. Higher temperatures, which correspond to higher $\theta_0$, increase the convergence rate of the network while the network converges to similar test accuracy for all the temperatures in the examined range. In FIG. 15, increasing the temperature leads to larger $\theta_0$ variance; thus, it increases the randomness of the MTJ switching time. Therefore, higher temperature leads to faster convergence.

TABLE 8

Temperature Effect on Test Accuracy for MNIST

| T[K] | 260 | 273 | 300 | 333 | 373 |
|---|---|---|---|---|---|
| $R_{off}[\Omega]$ | 2750 | 2650 | 2500 | 2150 | 2000 |
| $\theta_0$[rad] | 0.3187 | 0.3266 | 0.345 | 0.3617 | 0.3827 |
| Test Accuracy(%) | 98.14 | 98.32 | 98.66 | 98.82 | 98.88 |

Performance Evaluation

TNN Power and Area

The power consumption and area were evaluated for a single synapse and synapse array, including the interconnect parasitics. The results are listed in Table 9 below. During the read operation, all the synapses are read in parallel; therefore, the feedforward power is higher than the write power, where the columns are updated serially.

TABLE 9

Area and Power

| 2*Cell | 2*Area | Power | |
|---|---|---|---|
| | | XNOR + sum | Update |
| Single Synapse | 3.63 μm² | 1.89 μW | 2.72 μW |
| 64 × 64 Syn. array | 0.015 mm² | 7.31 mW | 1.64 mW |
| 128 × 128 Syn. array | 0.059 mm² | 28.5 mW | 3.25 mW |

Potential Performance

QNNs were proposed as a way to reduce the overall power consumption and complexity of the full precision DNNs; hence, the energy efficiency (in units of $$\frac{TOPs}{W})$$

of the present design was evaluated. For the feedforward phase in a 128×128 synapse array, 128×(128+128) GXNOR and accumulate operations are done in parallel (1OP=1b GXNOR/Accumulate/update). Therefore, the synapse array can reach $$2299\frac{TOPs}{W}$$

in this phase. When performing update, each update is counted as a single operation; the energy efficiency when updating the weights is thus $$39\frac{TOPs}{W}.$$

During the update phase the voltage source is set to guarantee a high current domain; the energy efficiency of the update operation is therefore bounded by the MTJ device properties.

System Performance (Test Case)

To evaluate the performance when integrating the present design to a full system, the following (but not the only possible) setup may be considered, when the performance will change for different setups. The synapse array is used as an analog computation engine and as memory for the weights; hence, the input and output to the array are converted to using 1-bit DAC and 8-bit ADC. In the inverse read phase, a bit-streaming method is provided in to compute the multiplication with the full-precision error data; thus, only a 1-bit DAC is needed. To generate the control signals, an 8-bit DAC, and voltage comparators are needed. The power and area of those components are listed in Table 9. The respective energy efficiency in the feedforward and update phases is $$18.3 \frac{TOPs}{W} \text{ and } 3 \frac{TOPs}{W},$$

where the power consumption of the data converters limits the overall performance. For the bit-streaming method with 8-bit precision for the error data, the energy efficiency of the inverse read operation is $$1.43 \frac{TOPs}{W}.$$

Additional Materials

DNN architecture is structured by layers of neurons connected by synapses. Each synapse is weighted, and the functionality of the network is set by supplying different values to those weights. To find the values suitable for a specific task, machine learning algorithms are used to train the network. After the training is complete, the network is provided with new data and it infers the result based on its training; this stage is called the inference stage.

The basic computation element in a DNN is the neuron. DNNs are constructed from layers of neurons, each of which determines its own value from a set of inputs connected to the neuron through a weighted connection called a synapse. Therefore, the value of the output is given by the weighted sum of the input, $$r_n = \Sigma_{m=1}^M W_{nm} x_m, \quad (31)$$

where $x_m$, $W_{nm}$, and $r_n$ are, respectively, the input neuron m, the connection weights (synapse weights) between neuron n and neuron m, and output n. In the general case, each connection has its own weight, and thus the output vector r is determined by a matrix-vector multiplication, $$r = Wx, \quad (32)$$

To perform matrix-vector multiplication, several multiply and accumulate (MAC) operation are needed. Applying new input to the network and computing the output is also referred to as feed-forward. When training a network, after the feed-forward the weights are updated in another phase called back-propagation.

In ternary neural networks, i.e. networks with weights and activation of $\{-1,0,1\}$, the complex MAC operation is replaced by a simple logic gated XNOR and popcount operations. The gated XNOR operation is described in Table 8 below:

TABLE 8

| Gated XNOR Operations | | |
|---|---|---|
| $x \in \{-1, 0, 1\}$ | $w \in \{-1, 0, 1\}$ | Gated XNOR |
| −1 | −1 | 1 |
| −1 | 0 | 0 |
| −1 | 1 | −1 |
| 0 | −1 | 0 |
| 0 | 0 | 0 |
| 0 | 1 | 0 |
| 1 | −1 | −1 |
| 1 | 0 | 0 |
| 1 | 1 | 1 |

Thus, to support ternary neural networks the hardware needs to support gated XNOR operation.

During the back-propagation phase, the new value of the weights (i.e., the update) is calculated using gradient-based optimization algorithms. During this phase, the error at the network output layer needs to be back-propagate to the internal layers of the network. As part of the computation another matrix-vector multiplication is performed, $y=W^T\delta$. The matrix vector cannot be replaced by the gated-XNOR operation, and the multiplication is performed as described in Table 9 below:

TABLE 9

| Gated XNOR Operations | | |
|---|---|---|
| $\delta \in \{-1, 0, 1\}$ | $w \in \{-1, 0, 1\}$ | Gated - XNOR |
| −\|δ\| | 0 | 0 |
| −\|δ\| | 1 | −\|δ\| |
| 0 | −1 | 0 |
| 0 | 0 | 0 |
| 0 | 1 | 0 |
| \|δ\| | −1 | −\|δ\| |
| \|δ\| | 0 | 0 |
| \|δ\| | 1 | \|δ\| |

After the back-propagation phase, the weights updated values, ΔW, are calculated. Then the weights are updated according to the GXNOR algorithm.

Note that the MTJ devices of the synapse of the present invention are used to store weights and perform XNOR operation. The synapse exploits stochastic writing of the weights to support stochastic training and process-in-memory (PIM) yielding reduced power consumption, reduced required memory capacity requirements, and faster training speeds.

To perform the gated XNOR logic operation between the synapse and activation values, the voltage sources denote the input value to the neuron. The logic values −1,0,1 are represented by $u \in \{-C_{rd}, 0, V_{rd}\}$. During this operation, $u_1 = u$ and $u_2 = -u$ are connected. The result is the output current sign $$I_{out} = (G_1 - G_2)u \quad (33)$$

where $G_1$, $G_2$ are the conductance of the two MTJs. As shown in Table 10 below, the polarity of $I_{out}$ depends on the input voltage and the synapse state. If u=0 or s=$0_w$, $0_s$, the output current is $I_{out} \approx 0$. However, if the state and input activation have the same polarity, then sign($I_{out}$)=1 else sign($I_{out}$)=−1.

TABLE 10

Gated XNOR truth table

| Input | Weight | $I_{out}$ | Output |
|---|---|---|---|
| −1 | −1 | $\frac{R_{off} - R_{on}}{R_{off}R_{on}}(-V_{dd})$ | 1 |
| −1 | 0 | 0 | 0 |
| −1 | 1 | $\frac{R_{off} - R_{on}}{R_{off}R_{on}}(-V_{dd})$ | −1 |
| 0 | −1 | 0 | 0 |
| 0 | 0 | 0 | 0 |
| 0 | 1 | 0 | 0 |
| 1 | −1 | $-\frac{R_{off} - R_{on}}{R_{off}R_{on}}(V_{dd})$ | −1 |
| 1 | 0 | 0 | 0 |
| 1 | 1 | $-\frac{R_{off} - R_{on}}{R_{off}R_{on}}(V_{dd})$ | 1 |

To perform feed forward with the GXNOR operation, the row output is grounded and the output currents from all synapses are summed based on KCL. Thus, the current through row i is given by $$I_{row,i} = \sum_{j=1}^{N}(G_{ij,R_1} - G_{ij,R_2})u_j = \frac{R_{off} - R_{on}}{R_{off}R_{on}}(N_{+1,i} - N_{-1,i})|u|, \quad (34)$$

where $G_{j,n/p}$, N, $N_{+1,i}$ and $N_{-1,i}$ are the conductivity of each MTJ, the number of synapses per row, the total number of positive synapses, and the total number of negative synapses in row i, respectively.

Regarding backpropagation, the error function $o=W^T\delta$ is used to determine the outputs used for the updates, where $o_j$ and $\delta_j$ may be 8 or 16-bit values, for example. The data is split into 'positive' and 'negative' columns. The $\delta$ value is input to each row which represents the inputs to one of M neurons. The current in each positive and negative column is summed and the difference $O_N$ between positive and negative sums are generated by a comparator or op amp. The N columns represent the inputs with each column representing a different input (or neuron output from a previous layer). The output from column i is given by $$O_i = \Sigma_{j=1}^{M}(G_+ - G_-)\delta_j = \Sigma_1^M S_1\delta_1 \quad (35)$$

Regarding weight updates, by exploiting the stochastic nature of the MTJ devices, the stochastic update is done in-situ. The weight update is done at the high current regime, guaranteed by the update input voltage $V_{up}=V_{in}+I_{c0}R_{mid}>I_{c0}R_{off}$, where $R_{mid}=(R_{off}+R_{072})/2$. Thus, the switching probability of each MTJ is defined by $$P_{switch} = P(\Delta t > \tau) = P\left(\frac{\Delta tu}{R}\right) = 1 - \text{erf}\left(\frac{\pi}{2\sqrt{2}\,\theta_0\,\exp\left(\frac{\Delta tu_{in}}{CR}\right)}\right) \quad (36)$$

where $$C = \frac{2I_{c0}}{\alpha\gamma\mu_0 M_s},$$

$\Delta t$ is the update duration, u is the voltage drop over the device, and R is the resistance of the device. Note that the probability is a function of $\Delta t$ and $u_{in}$. The update duration is set to be $P(T_{up}) \approx 1$. To support gated XNOR algorithm, each column is updated once per cycle, where $\Delta W=\text{sign}(\Delta W)|\Delta W|$, $u_1=-u_2=V_{up}$, and $e_{1,n\backslash p}$ and $e_{2,n\backslash p}$ are control signals that (1) select the sign of the update $\text{sign}(\Delta W)=\text{sign}(u_{1,2})$, and (2) open the source transistor to $\Delta t=|\Delta W|$.

To support advanced optimization algorithms such as the well-known ADAM algorithm with the synapse array, it is assumed that the update value is computed outside the synapse array and it provided as an input to the synapse array. The update process is iterative, where a single column is updated at each iteration. However, a higher level of parallelism can be achieved for stochastic gradient descent. The update value $\Delta$ is represented by the update duration and the voltage drop over the device. So, $\Delta t=\text{abs}(\Delta)$ and $\text{sign}(u)=\text{sign}(\Delta)$. To support this scheme, the voltage sources are set to $u_1=u_2=V_{up}>0$ at all columns, and the update period $T_{up}$ is chosen to ensure that $P_{switch}(T_{up}V_{up}) \approx 1$. The control signals are used to select the update sign and update duration per row. If $\text{sign}(\Delta)>0$, the control signals selects $\{u_1,\overline{u_2}\}$; otherwise, it selects $\{\overline{u_1},u_2\}$. Also, the control signals open the transistors for $T_{eff}=\lambda T_{up}$, $\lambda\in[0, 1]$, when $T_{eff}$ is the time period during which the voltage source is connected. To support the GXNOR algorithm, the update is done with respect to $k_{ij}$ and $v_{ij}$, meaning that one MTJ is updated with $\Delta=k_{ij}$ and the other with $\Delta=v_{ij}$.

The control signal functionality is given by $$\begin{cases} e_{1,p} = -e_{2,p} = -\text{sign}(\Delta W)V_{dd} & \text{if } \lfloor \Delta W \rfloor \neq 0 \\ e_{1,p} = e_{2,p} = V_{dd} & \text{else} \end{cases} \quad (27)$$

$$e_{1,n} = \begin{cases} -\text{sign}(\Delta W)V_{dd} & 0 < t < |v|T_{up} \\ -V_{dd} & |v|T_{up} < t < T_{up} \end{cases} \quad (38)$$

$$e_{2,n} = \begin{cases} \text{sign}(\Delta W)V_{dd} & 0 < t < |v|T_{up} \\ -V_{dd} & |v|T_{up} < t < T_{up}. \end{cases} \quad (39)$$

or

If $k_{ij} \neq 0$: $e_{1,p\backslash n}$ is open for $\Delta t = T_{up} \rightarrow P_{sw} \approx 1$ If $v_{ij} \neq 0$: $e_{2,p\backslash n}$ is open for $\Delta t = vT_{up} \rightarrow P_{sw}(v_{ij})$ Thus, the switching probability is a function of the effective update duration and the current polarity, both defined by the control signals. When the update sign is positive $M_1$ is updated as a function of k, and $M_2$ is updated as a function of v. The different zero states have different switching probabilities, but for each zero state the probability of switching to −1 and 1 is equal. The dashed line represents the switching probability for the GXNOR algorithm for S=−1,1.

The drawback of this circuit is the double representation of zero, which has non-symmetric switching behavior. The above-mentioned update scheme is a partial solution to make the switching response more symmetric.

To implement the control signal functionality comparators may be used. The positive port of the comparator is fed with the voltage signal, $V_p=vV_{dd}$, and the other port is connected to a saw signal, which maintains $V_{saw}(T_{up})=V_{dd}$. Thus, if $V_i=v_iV_{dd}>0$, the $-V_{saw}$ is always smaller than v.

Therefore, $e_{i1,n}=-V_{dd}$ and $N_p$ is closed. $e_{i2,n}=V_{dd}$ as long as $V_{saw} < vV_{dd}$, meaning that $N_2$ will be open for $T_{wr,eff}=vT_{wr}$.

In a first example, consider an update including $W=-1$, $\Delta W_{ij}=1.5$, then $k_{ij}=1$ and $v_{ij}=0.5$. Thus, $P_{sw,1} \approx 1$, and $$P_{sw,2} = P\left(\frac{0.5T_{up}u}{R}\right).$$

Device $M_1$ moves from $R_{off}$ to $R_{on}$ and $M_2$ may move from $R_{on}$ to $R_{off}$ with probability $$P\left(\frac{0.5T_{up}u}{R}\right).$$

The control transistor $P_1$ is open for a duration $\Delta t = T_{up}$ while the control transistor $N_2$ is open for a duration $\Delta t = v_{ij}T_{wr}$ related to the probability $P(0.5)$. The state of the synapse moves from $-1$ to $0$ to $1$. Note that the move from $0$ to $1$ is not deterministic. The move from $0$ to $1$ occurs with probability $$P\left(\frac{0.5T_{up}u}{R}\right).$$

In a second example, consider an update including $W=0_w$, $\Delta W_{ij}=-0.5$, then $k_{ij}=0$ and $v_{ij}=-0.5$. Thus, $$P_{sw,1} = P\left(\frac{0.5T_{up}u}{R}\right),$$

$P_{sw,1} \approx 0$. Device $M_1$ moves from $R_{on}$ to $R_{off}$ and $M_2$ moves from $R_{on}$ to $R_{off}$ in a non-deterministic manner. The control transistor $N_2$ is closed while the control transistor $N_1$ is open for a duration $\Delta t = v_{ij}T_{wr}$ leading to a switching probability of $P(0.5)$. The state of the synapse moves from $0_w$ to $-1$ with probability $$P\left(\frac{0.5T_{up}u}{R}\right).$$

Regarding inverse reads, to train the TNN, backpropagation of the error should be performed. Thus, an inverse matrix vector multiplication $W^T y$ is supported using the output row interface as input. This allows the same synapse array to be reused. Due to the synapse structure, the data is separated into two columns, where the output data is given by $I_{i,p}-I_{i,n}$, the currents through each column. Therefore, the data may be converted into voltage and used as the voltage comparator.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A ternary synapse device comprising:
first and second magnetic tunnel junction (MTJ) devices, wherein each of said MTJ devices has a fixed layer port and a free layer port, and wherein said fixed layer ports of said first and second MTJ devices are connected to each other;
a first control circuit connected to the free layer port of said first MTJ device and configured to provide a first control signal; and
a second control circuit connected to the free layer port of said second MTJ device and configured to provide a second control signal;
wherein said ternary synapse device is configured to perform a gated XNOR (GXNOR) operation between a ternary synapse weight and one or more binary, or ternary activation values; and wherein an output of the GXNOR is represented by a sum of the output currents through both of said first and second MTJ devices.

2. The synapse device of claim 1, wherein said synapse device is configured to store the ternary synapse weight represented by a state of the MTJ devices.

3. The synapse device of claim 2, wherein said ternary synapse weight is defined as, and stored as a combination of respective resistance values of each of said first and second MTJ devices.

4. The synapse device of claim 2, wherein said synapse device is further configured to perform in-situ stochastic update of said ternary or binary synapse weights.

5. An array of synapse devices comprising:
a plurality of ternary synapse devices of claim 1, arranged in an array of rows and columns,
wherein all of said synapse devices arranged in any one of said columns share an input voltage,
wherein all of said synapse devices arranged in any one of said rows share said first and second control signals, and
wherein outputs of all of said synapse devices arranged in any one of said rows are connected.

6. The array of claim 4, wherein said array forms a trainable neural network, wherein feedforward is calculated by connecting a row output to ground potential, and summing output currents from all synapses in that row based on Kirchoff's Current Law (KCL).

7. The array of claim 6, wherein said neural network represents a synaptic weight matrix comprising all of said synapse weights of each of said synapse devices in said array.

8. The array of claim 7, wherein an output vector of said neural network is calculated as a weighted sum of all of said input voltages multiplied by said synaptic weightings matrix.

9. A method comprising:
providing an array of synapse devices arranged in rows and columns, wherein each of said synapse devices comprises:
first and second magnetic tunnel junction (MTJ) devices, wherein each of said MTJ devices has a fixed layer port and a free layer port, and wherein said fixed layer ports of said first and second MTJ devices are connected to each other,
a first control circuit connected to the free layer port of said first MTJ device and configured to provide a first control signal, and
a second control circuit connected to the free layer port of said second MTJ device and configured to provide a second control signal,
wherein said first and second control circuits are configured to perform a gated XNOR (GXNOR) operation between synapse and activation values, and wherein an output of the GXNOR is represented by the output current through both of said first and second MTJ devices,
wherein all of said synapse devices arranged in any one of said columns share an input voltage,
wherein all of said synapse devices arranged in any one of said rows share said first and second control signals, and
wherein outputs of all of said synapse devices arranged in any one of said rows are connected; and
at a training stage, training said array of synapse devices by:
(i) inputting all of said input voltages associated with each of said columns,
(ii) setting said first and second control signals associated with each of said rows to perform said GXNOR operation, and
(iii) calculating an output vector of said array as a weighted sum of said input voltages multiplied by a synaptic weightings matrix comprising synapse weights of all of said synapse devices in said array.

10. The method of claim 9, wherein said training further comprises comparing said output vector to a training dataset input, wherein said comparing leads to an adjustment of said synaptic weightings matrix.

11. The method of claim 9, wherein each of said synapse devices is configured to store said synapse weight represented by a state of the MTJ devices, wherein said synapse weight is ternary or binary.

12. The method of claim 11, wherein said synapse weight is defined as and stored as a combination of respective resistance values of each of said first and second MTJ devices.

13. The method of claim 11, wherein each of said synapse devices is further configured to perform in-situ stochastic update of said ternary or binary synapse weights.

14. The method of claim 11, wherein said array forms a trainable neural network.

15. The method of claim 14, wherein said neural network represents said synaptic weight matrix comprising all of said synapse weights of each of said synapse devices in said array.

16. The method of claim 15, wherein said output vector of said neural network is calculated as a weighted sum of all of said input voltages multiplied by said synaptic weightings matrix.

17. A computer memory structure comprising:
a plurality of ternary synapse devices, each comprising:
first and second magnetic tunnel junction (MTJ) devices, wherein each of said MTJ devices has a fixed layer port and a free layer port, and wherein said fixed layer ports of said first and second MTJ devices are connected to each other,
a first control circuit connected to the free layer port of said first MTJ device and configured to provide a first control signal, and
a second control circuit connected to the free layer port of said second MTJ device and configured to provide a second control signal,
wherein said ternary synapse devices are configured to perform a gated XNOR (GXNOR) operation between a ternary synapse weight and one or more binary, or ternary activation values; and wherein an output of the GXNOR is represented by a sum of the output currents through both of said first and second MTJ devices.

18. The array of claim 6, wherein at a training stage, the first control signal and second control signal of a ternary synapse are applied as voltage pulses, wherein a sign and a duration of the voltage pulses are calculated according to a gradient-based update value of said ternary synapse, so as to ensure a required switching probability of MTJ devices of that ternary synapse.

* * * * *